United States Patent [19]

Halbert et al.

[11] Patent Number: 4,718,036
[45] Date of Patent: Jan. 5, 1988

[54] COMPARATOR-INTEGRATOR LOOP FOR DIGITIZING A WAVEFORM

[75] Inventors: Joel M. Halbert; Myron J. Koen, both of Tucson, Ariz.

[73] Assignee: Burr-Brown Corporation, Tucson, Ariz.

[21] Appl. No.: 792,177

[22] Filed: Oct. 28, 1985

Related U.S. Application Data

[62] Division of Ser. No. 543,853, Oct. 20, 1983, Pat. No. 4,641,246.

[51] Int. Cl.$^4$ .................. G06G 7/18; H03M 3/02; H04B 14/06
[52] U.S. Cl. ..................... 364/829; 332/11 D; 375/28; 364/487
[58] Field of Search ............ 364/487, 513.5, 829; 375/28, 30; 332/11 D

[56] References Cited

U.S. PATENT DOCUMENTS

| | | | |
|---|---|---|---|
| 2,803,702 | 8/1957 | Ville et al. | 375/28 |
| 4,101,881 | 7/1978 | De Freitas | 375/28 X |
| 4,309,760 | 1/1982 | D'Antonio | 364/829 X |
| 4,375,329 | 3/1983 | Park | 364/513.5 X |
| 4,433,311 | 2/1984 | Noguchi et al. | 375/28 X |

Primary Examiner—Felix D. Gruber
Attorney, Agent, or Firm—Harry M. & Associates Weiss

[57] ABSTRACT

A latching comparator has a signal input connected to the output of a device under test. A strobe input of the comparator has a strobe signal applied thereto, whereby the output of the device under test is repeatedly sampled. The output of the comparator drives an integrator, preferably through a filter. The output of the integrator drives a reference input of the comparator and a computer. The computer is driven via an A/D converter, whereby a digitized representation of the output of the device under test is provided to the computer.

9 Claims, 22 Drawing Figures

COMPARATOR-INTEGRATOR LOOP FOR DIGITIZING A WAVEFORM

This application is a division of application Ser. No. 543,853, filed Oct. 20, 1983 now U.S. Pat. No. 4,641,246.

BACKGROUND OF THE INVENTION

1. Field of the Invention

The present invention relates to a sampling waveform digitizer and more particularly to a sampling waveform digitizer which is suitable for the production testing of high performance analog and data conversion components.

2. Description of the Prior Art

One of the most challenging requirements facing a supplier of high speed, precision data conversion components is the accurate and efficient measurement of dynamic performance parameters.

Important dynamic characteristics are usually determined via rather painstaking laboratory evaluation of a few randomly selected devices. Often, the procedure involves the use of several different fixtures, and requires skilled technicians to operate the instruments and record the results properly. The performance specifications are then published as "typical", or "guaranteed but not 100% tested", neither of which is very satisfactory from the customer's point of view.

Some measurements, such as settling time of a fast current output digital-to-analog converter (DAC), are traditionally so difficult to perform that the published specification is in fact only a "best guess" which the customer must verify by observing the device's apparent performance in his particular circuit.

Therefore, it is becoming increasingly desirable to perform these difficult dynamic measurements on a production basis as well as in the design laboratory. This requires that several different characteristics, including settling time, slew rate, bandwidth, time delay, and the like must be tested quickly, reliably, and with minimal socket changing or operator intervention.

These requirements became abundantly clear to the present inventors during the early development stages of a family of high speed data conversion components; namely, two fast-settling digital-to-analog converters and a high speed sample and hold amplifier. The digital-to-analog converters, both ECL and TTL input versions, were required to settle to 0.01% accuracy in 40 nanoseconds and the sample and hold amplifier was required to acquire a 10 volt signal to the same accuracy in approximately 250 nanoseconds. Because the most important design choices were those that affected the speed and accuracy performance, it was necessary to be able to measure the dynamic parameters reliably and verifiably. Also required was a technique suitable for medium to high volume production testing as well as one that customers could use for performance evaluation and incoming inspection.

Various other techniques or alternate approaches exist in the prior art, including (1) high speed clipping amplifiers with oscilloscope viewing of the output; (2) sampling oscilloscopes; (3) window comparator techniques; and (4) commerical waveform digitizers.

Conventional wideband oscilloscopes are suitable for measuring the dynamic characteristics to only 1 or 2% accuracy, at most. Precise settling time measurements cannot be made directly because the very large dynamic range of the signal overloads the oscilloscope amplifiers. Therefore, test circuits have been developed specifically to prevent overloading within the oscilloscope.

By clipping the test waveform with diodes or special "clipping amplifiers", it is possible to display the waveform on the most sensitive scale without severe overloading. However, the measurement accuracy still depends on several high speed, open loop amplifiers between the signal source and the display screen. The clipping circuit and amplifiers are themselves prone to thermal tails, ground loops and signal distortion.

Another prior art technique to prevent oscilloscope overloading is to sum the settling waveform with a step generator of the same amplitude but opposite polarity, so that the large signal excusions are cancelled out. This method requires that the settling time of the step generator itself be significantly shorter than that of the device under test, presenting a problem of test verification. If the settling characteristic of the step generator could be measured, the capability of making the original settling time measurement would already exist. Therefore, the step generator is assumed to settle well-based on theoretical circuit calculations rather than experimental verification.

Signal clipping and step generator techniques have been used successfully to measure current-mode DAC settling up to 12 bit resolution, but a high level of expertise in engineering art is required to implement them properly. Interpretation of the displayed waveform is subject to operator error and the test fixture is limited to settling time measurement alone. Evaluation of other parameters still requires a various assortment of fixtures and equipment hookup configurations within the laboratory.

Sampling oscilloscopes have a very high bandwidth and avoid the overload problem of conventional types, but the accuracy of the internal diode sampling bridge is limited to one or two millivolts. Also, there are numerous practical problems in attempting to drive the low input impedance.

An interesting method of testing settling time on a production basis exists in the prior art, and this system uses a window comparator with adjustable thresholds. Once the DC final value of the waveform is determined, a system of DACs sets the reference levels at the positive and negative limits of the error band. The test stimulus is then applied to the device under test (DUT), and the window comparator output is enabled after the allowable settling time has elapsed. If the DUT output then exceeds the error band, the comparator triggers a flip-flop to indicate a settling time failure.

The window comparator method is suitable for pass/fail production testing of moderately high speed waveforms. However, it does not lend itself to laboratory development or characterization work, because it gives no information above the actual shape of the waveform itself.

To meet the needs of both the development laboratory and the production floor, a system which permanently records the detailed waveshape is required. In other words, the ideal system is an accurate, high speed waveform digitizer.

Recognizing this, test equipment manufacturers have developed digitizers in various forms. Waveform recorders, transient recorders, and digital oscilloscopes are all designed to capture and store a set of time-amplitude points in digital form. Once the signal has been digitized, it is equally useful for production pass/fail decisions as for detailed engineering analysis.

While the digitizer concept is attractive, commercially available units do not yet offer the combination of bandwidth and resolution necessary for the type of high accuracy measurements under consideration herein, such as for the dynamic testing of high speed data conversion components and the like.

A sampling waveform digitizer is needed which is both highly accurate and generally useful for dynamic testing and characterization of various waveforms. It must be relatively inexpensive and well-suited for both production and design engineering environments.

The present invention eliminates most of the deficiencies of the prior art and provides a sampling waveform digitizer for performing dynamic testing on high speed data conversion components including completely automated dynamic performance characterizations of sample and hold amplifiers and relatively fast digital-to-analog converters including accurate measurements of settling time. These have been implemented in the present invention and various system parameters can be measured including acquisition time, sample-to-hold settling time, aperture delay, glitch amplitude, sample-to-hold offset, feedthrough rejection, risetime, slew rate, and the like.

SUMMARY OF THE INVENTION

The present invention reaches a sampling waveform digitizer for the dynamic testing of high speed data conversion devices and includes a source of waveform signals to be tested. A comparator means having at least first, second, and third inputs and at least one comparator output is provided, along with means for operatively coupling the waveform signal to be tested to the signal input of the comparator means. Means for integrating the output signal from the output of the comparator means is provided along with a feedback path for supplying the integrated output signal back to the reference input of the comparator to form a comparator-integrator feedback loop means.

A control means is provided for programmably selecting a sample point in the waveform signal to be tested and control means is provided for generating a sequence of narrow strobe pulses with programmable phase relative to the test waveform. The digitizer also includes means for operatively coupling the strobe pulses to the latch enable input of the comparator for repeatedly strobing the comparator at a selected sample point in time until the feedback of the integrated output signal forces the signal present at the reference input of the comparator to be equal to the sampled value of the input waveform signal being tested, at which time the feedback signal oscillates about the sample value and the loop settles. An analog-to-digital conversion device reads the final value once the loop is settled, and converts it into a digital equivalentt value of the time and equivalent value of the amplitude of the sampled value and other parameters for storage and software processing and analysis in the digital computer.

Preferably, the entire process is under the program control of a digital computer which serves as the control means, and the computer selects and controls the programmable delay line for selecting the test point in the waveform signal.

The source of waveform signals can be a device under test for outputting the waveform signal or an external device responsive to a test stimulus or the like. The source can be an external real time waveform signal and means are provided for triggering on the signal for clocking the program delay means. Similarly, a phase locked loop (PLL) can be used for locking onto the signal and generating the programmed delay means.

Alternatively, a sampling waveform digitizer for accurately measuring various parameters on a test device such as settling time of a high speed digital-to-analog converter, can be provided which incldues a digital computer, means for generating a test stimulus, a polarity select means, a programmable delay line, a comparator integrator loop for integrating the input waveform, and analog-to-digital converter means for converting the output to a digital representation and supplying it to the digital computer.

The invention further contemplates an improved comparator-integrator loop circuit including a T-filter means operatively dispsoed in a path between the latching comparator output and the operational amplifier inputs for smoothing out the signal spikes and controlling the integrator current and thus the slope of the integrater for improved accuracy. Further, a similar T-filter can be provided in the return loop for buffering the integrater output from the disturbances which can result from clocking the latch enable input of the latching comparator or from disturbances caused by the switching action of the latching comparator input, for preventing ringing, and for rounding out signal spikes in the feedback loop.

Still another embodiment provides a sampling waveform testing system for dynamically testing a high speed sample and hold amplifier to measure such parameters as acquisition time, aperture delay, sample-to-hold settling time, glitch amplitude, slew rate, sample-to-hold offset, hold mode feedthrough rejection, risetime, and the like. The testing system includes a digital computer, means for generating clock signals, and 8 bit binary counter for counting the clock signals and storing the count, and a magnitude or amplitude comparator means for comparing the stored count with the upper 8 bits of a 16 bit delay select control word output from the digital computer. When a positive comparison indicates that the signals are equal, an output is sent to the programmable delay line, which stores the lower 8 bits of the 16 bit delay select control word for "fine" tuning the delay signal, which is then differentiated and level-shifted to provide the comparator strobe signal.

A shift register is provided for delaying the clock signals to generate a first square wave test stimulus having a predetermined period and a second shift register signal which is delayed a predetermined time period. An additional means for delaying the first square wave test stimulus is used to generate a polarity select signal and a fast settling square wave generating means supplies a +5 volt square wave signal for dyanmically driving the sample and hold amplitude circuit under test. The hold/sample select circuit responds to program control for generating a hold polarity select signal which is supplied to the hold input of the sample and hold device under test. Both the square wave test stimulus and the sample/hold sample select signal can be programmably controlled via the polarity select circuitry to have the square wave generator or sample and hold circuit utilize the input, invert the input, or ignore the input signal. An output circuit, including a plurality of comparator-integrator loops, is used for sampling and integrating various signals from the S/H under test and generating final values as previously indicated. The loop means includes latching comparators and analog output integrators, together with the modified T-filter means for improving the performance of the comparator-integrator loop. An analog multiplexer determines which of the outputs of the particular loop means or individual comparators is to be read at a particular moment in time and the reading is supplied to an analog-to-digital converter for supplying the digital equivalent thereof to the digital computer for storage, and further processing and analysis.

The present invention provides a highly accurate and flexible measurement technique and apparatus which achieves previously unattainable results in the measurement of settling time and also meets all the essential requirements of a production tester. The present system can easily be adapted to measure the dynamic characteristics of operational amplifiers, digital-to-analog converters, sample and hold amplifiers, and other analog system components, regardless of their high speed operation. Additionally, the flexibility of the present system makes it suitable for testing the dynamic switching characteristics of digital logic circuits as well.

Other advantages and meritorious features of the present invention will be more fully understood from the following detailed description of the drawings and the preferred embodiment, the appended claims, and the drawings which are described briefly hereinbelow.

DETAILED DESCRIPTION OF THE DRAWINGS

Figure 1:
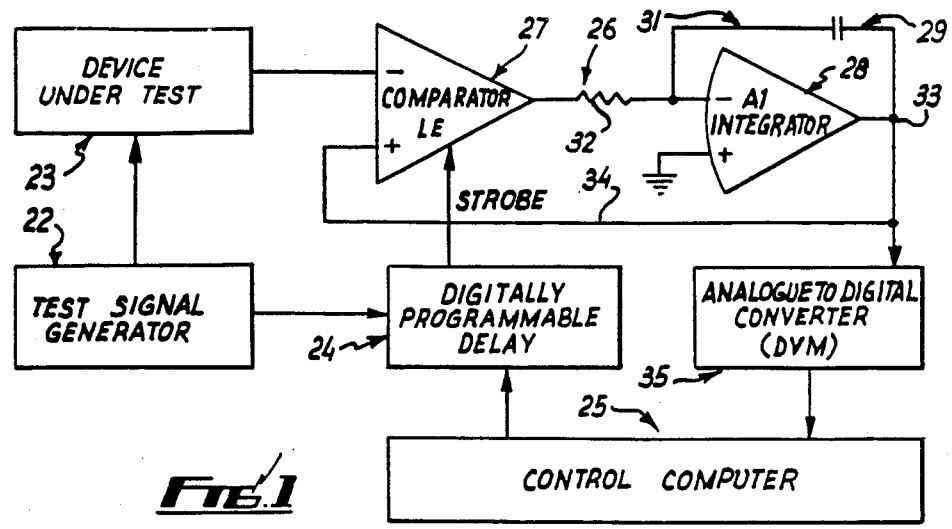
FIG. 1 is a block diagram of the sampling waveform digitizer of the present invention.

FIG. 1 is a block diagram of the sampling waveform digitizer of the present invention. The output of a test signal generator 22 is supplied as a test stimulus to a device under test 23. The output of the device under test is supplied to the inverting or signal input of a latching comparator 27 of a comparator-integrator loop 26. An output of the test signal generator 22 is also supplied as an input to a digitally progammable delay 24 which is controlled by control signals or commands from a digital control computer 25. The output of the digitally programmable delay 24 produces strobe pulses which are supplied to the latch enable input of the latching comparator 27 for strobing the input to sample the waveform signal present at the inverting input. The output of the latching comparator 27 is connected to one terminal of a resistor 32 whose opposite terminal is connected to the inverting input of an operational amplifier 28. The operational amplifier 28 includes an integrating capacitor 29 operatively coupled between the inverting input and the analog amplifier output node 33 for forming an integrator 31. The integrator output node 33 is connected via feedback loop 34 to the noninverting reference input of the latching comparator 27 to complete the formation of the comparator-integrator loop 26. The integrator output 33 is also connected to an input of an analog-to-digital converter 35 which is controlled under command of the computer 25 to output the digital equivalent of the integrated sampled value present at the integrater output 33 and for transferring the digital equivalent thereof to the computer for storage and for future processing and/or analysis.

The operation of the block diagram of FIG. 1 will now be briefly described with reference thereto. The waveform under test is supplied from the output of the device under test 23 and fed to the inverting or signal input of the latching comparator 27. The comparator's digital output is integrated by the operational amplifier 28 and integrating capacitor 29 combination 31, and the integrator output 33 is fed back via feedback lead 34 to the non-inverting or reference input to the latching comparator 27. The test signal generator 22 supplies a signal to the input of the digitally programmable delay 24 which selects, under computer command, a predetermined delay which is used to generate the strobe signals for sampling the latching comparator 27. As the latching comparator 27 is repeatedly strobed by the pulses at the latch enable input, the waveform signal at the inverting input is repeatedly sampled and integrated by the integrator 31. The signal at the integrator output 33 ultimately forces the signal present at the non-inverting input of the latching comparator 27, via feedback lead 34, to equal the sampled value and produce an equilibrium condition when the integrator output oscillates about the sampled value. Once the loop settles, this final value is read by the analog-to-digital converter 35 and sent to the computer 24 for storage and further processing.

Figure 2:
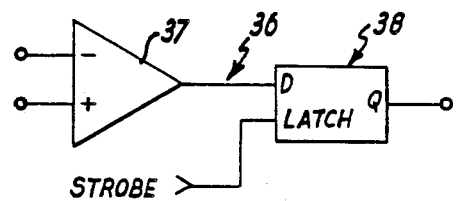
FIG. 2 is a block diagram of the functional equivalent of a conventional comparator whose output is latched with a "D"-type flip-flop.

The latching comparator 36 of FIG. 2 is functionally equivalent to a conventional comparator 37 whose output is latched with a "D"-type flip-flop 38. The comparator's strobe input would then correspond to the clock input of the flip-flop 38.

Figure 3:
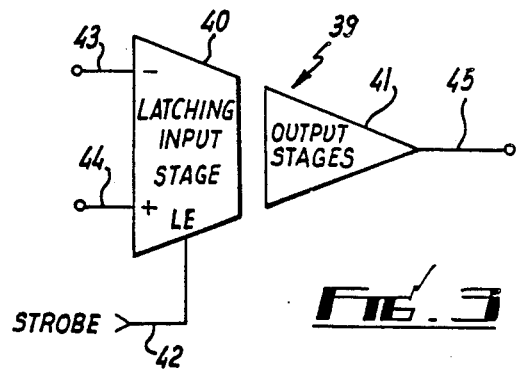
FIG. 3 is a block diagram of a true latching comparator as used in the present invention.

However, in a true latching comparator, such as shown in FIG. 3, the latching action occurs in the analog input stage 40 of the latching comparator 39. The latching comparator 39 also has output stages 41, an inverting or signal input lead 43, a non-inverting or reference input lead 44, and a strobe input lead 42 operatively coupled to a latch enable input in the first analog input stage 40 of the comparator 39. The output stages 41 supply the output of differential output signals via lead 45, as conventionally known in the art.

Since the latching action occurs in the analog input stage 40 and since the analog input stage 40 has only moderate gain but very high bandwidth, the propapagation delay and bandwidth limitation in the high gain output stages do not affect the accuracy of the measurement of the sample taken by the latching flip-flop 39. Because the latching event is edge-triggered, the effective aperture time is well under 500 picoseconds.

The repetitive sampling technique, often referred to as "equivalent time sampling", has several important advantages over transient recorders or window comparator methods. First of all, random noise in the system is averaged out by the operation amplifier integrator 31. The effectiveness of this noise averaging is determined by the integration constant and the number of samples taken at each time point. This is in contrast to the single shot "transient recorder" type of digitizer in which the sample and hold amplifier acts as a peak detector for the system noise.

Secondly, the operational amplifier integrator 31 operates at very low frequencies, essentially DC, relative to the waveform under test. Only the comparator input circuitry is required to track the input waveform and so there is no need for a precision high speed amplifier, which is a significant limitation in conventional sampling systems.

A third important advantage of the repetitive sampling technique used in the present invention is that the measurement resolution is not limited by the compara-tor's tendency to oscillate for very small differential input voltages. In other systems, this "oscillation band" which is typically 1 to 5 millivolt for high speed comparators, is a significant resolution limit. The oscillation can be prevented by adding positive feedback, but the resultant hysteresis around the comparator trip point is also detrimental to the system accuracy.

In the sampling waveform digitizer of the present invention, this oscillation is prevented by strobing the laching comparator with a relatively narrow pulse (5 to 10 nanoseconds wide). This enables the feedback loop to track the sampled value with far greater precision than the "oscillation limit" would suggest. In the present system, the resolution limit is approximately 50 microvolts or roughly 50 times more precise than the accuracy of the comparator alone.

The selection of the integration constant is important in order to maintain this resolution. The integrator output slope must be small enough so that the $$dV_{out}/dt = I_{in}/C_F$$

integrater output changes by a negligible amount between samples. One sample is taken per cycle of the input waveform so that the time between samples is equal to the period $T_o$:

$$t_{between\ samples} = T_o = 1/f_o$$

If the difference $\Delta V_{max}$ represents the largest allowable integrator error, the maximum slope is calculated by the equation:

$$dV_{out}/dt = \Delta V_{max}/T_o = I_{in}/C_F$$

where $I_{IN}$ is determined by the value of the integrator input resistor $R_{IN}$ and the magnitude of the comparator's output voltage.

Figure 4:
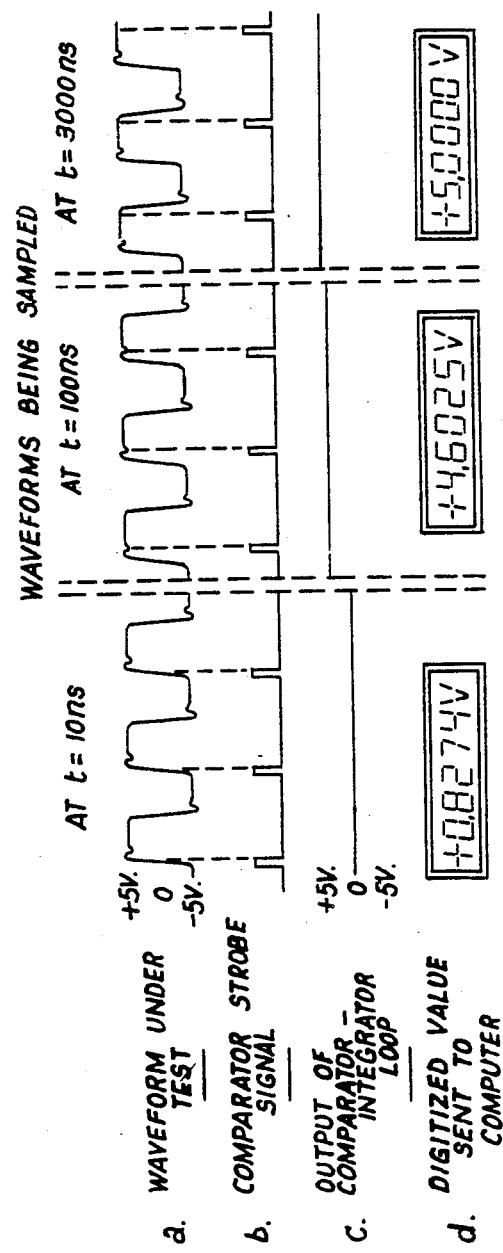
FIG. 4, including 4(a), 4(b), 4(c), and 4(d), is a waveform diagram illustrating the sampling digitization process of the present invention.
Figure 5:
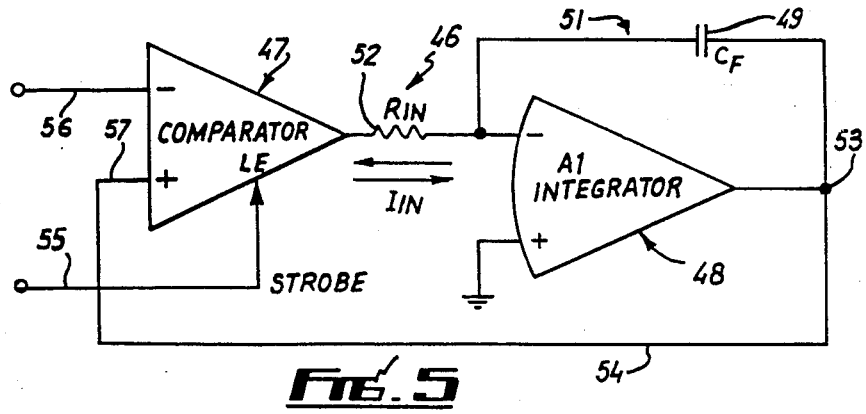
FIG. 5 is a block diagram of a conventional comparator-integrator loop.
Figure 6:
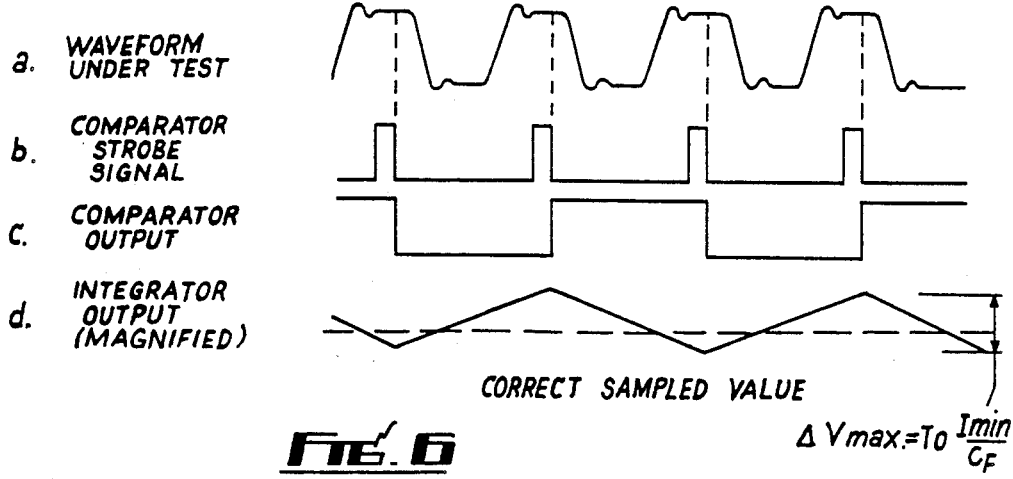
FIG. 6, including 6(a), 6(b), 6(c), and 6(d), are waveform diagrams illustrating the integrator error calculation for the system of the present invention.

FIG. 4 shows the waveform digitization technique of the present invention, while FIG. 5 may be used to understand the equations presented herein. FIG. 6 shows the waveforms used to calculate integrator error as follows. The correct sampled value will not necessarily equal the average value of the integrater output, but may lie anywhere between the positive and negative limits as seen in FIG. 6. Thus, it is important to select a small enough value for $-V_{max}$. For example, if the waveform under test has a frequency of 1 MHz and the maximum allowable error is set to be 50 microvolts, the integration constant will be:

$$dV_{out}/dt = \Delta V_{max}/T_o = I_{in}/C_F = 50\ \mu V/\mu s$$

In the case of a lower frequency waveform which must be measured to a very high degree of accuracy, the $I_{IN}/C_F$ ratio will be much smaller. As the output slope decreases, it may begin to take an intolerably long time for the comparator-integrator loop to acquire a full scale step change. In that case, the integrator can be designed with a variable $I_{IN}/C_F$ which can be large enough to allow for fast acquisition of large changes in the sample value and small enough to allow for precision tracking.

The selection of the sampling increment is also important because the digitizer operates in a synchronous sampling mode rather than in real time so that the time base resolution may be arbitrarily small. The programmable delay line used in the present system is variable in 1 nanosecond increments, yielding a maximum effective "sampling rate" of 1 GHz. This allows for accurate delay and risetime measurements, but it does not imply that the system can digitize a 1 GHz waveform. The bandwidth of the comparator input stage is limited to about 100 MHz which is adequate for the devices under consideration. If it becomes desirable to accurately digitize higher frequency components, a latching comparator with a higher frequency input stage, and a shorter aperture time would be required.

Although the system is capable of sampling the waveform in 1 nanosecond steps, the actual time increment used depend upon the parameter under test. For example, the measurement of signal delay to 1 nanosecond accuracy requires waveform digitization over several adjacent points while measurement of slew rate requires digitization of only 2 points that may be 10s or 100s of nanoseconds apart. To make the test run quickly, it is desirable to take as few time amplitude points as possible without compromising the validity of the measurement.

Figure 7:
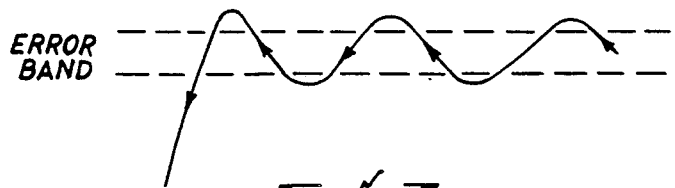
FIG. 7 is a waveform of an oscillatory settling response which exceeds the limits of a predefined error band between samples.

For settling time measurements, the required time base resolution is not immediately obvious. If too few samples are taken over the period of interest, it is possible that the waveform could exceed the error band between samples. To illustrate this point, consider the case of an oscillatory settling response such as that shown in FIG. 7. If the sampling increment is an integer multiple of the oscillation period, the sample points may easily coincide with the zero crossings of the waveform. In that case, the measured settling time would be very much shorter than the actual settling time.

One way to prevent this type of error is to apply the Nyquist sampling criterion:

$$T_s < 1/f_{max}$$

where $T_s$ is the sampling increment and $f_{max}$ is the highest frequency component of the waveform. However, strict use of the Nyquist rate is required only when the signal to be digitized is completely randon or completely unknown. Because the settling waveform is not entirely random, reasonable assumptions may be made to reduce the number of sampling points and thereby speed up the test.

Figure 8:
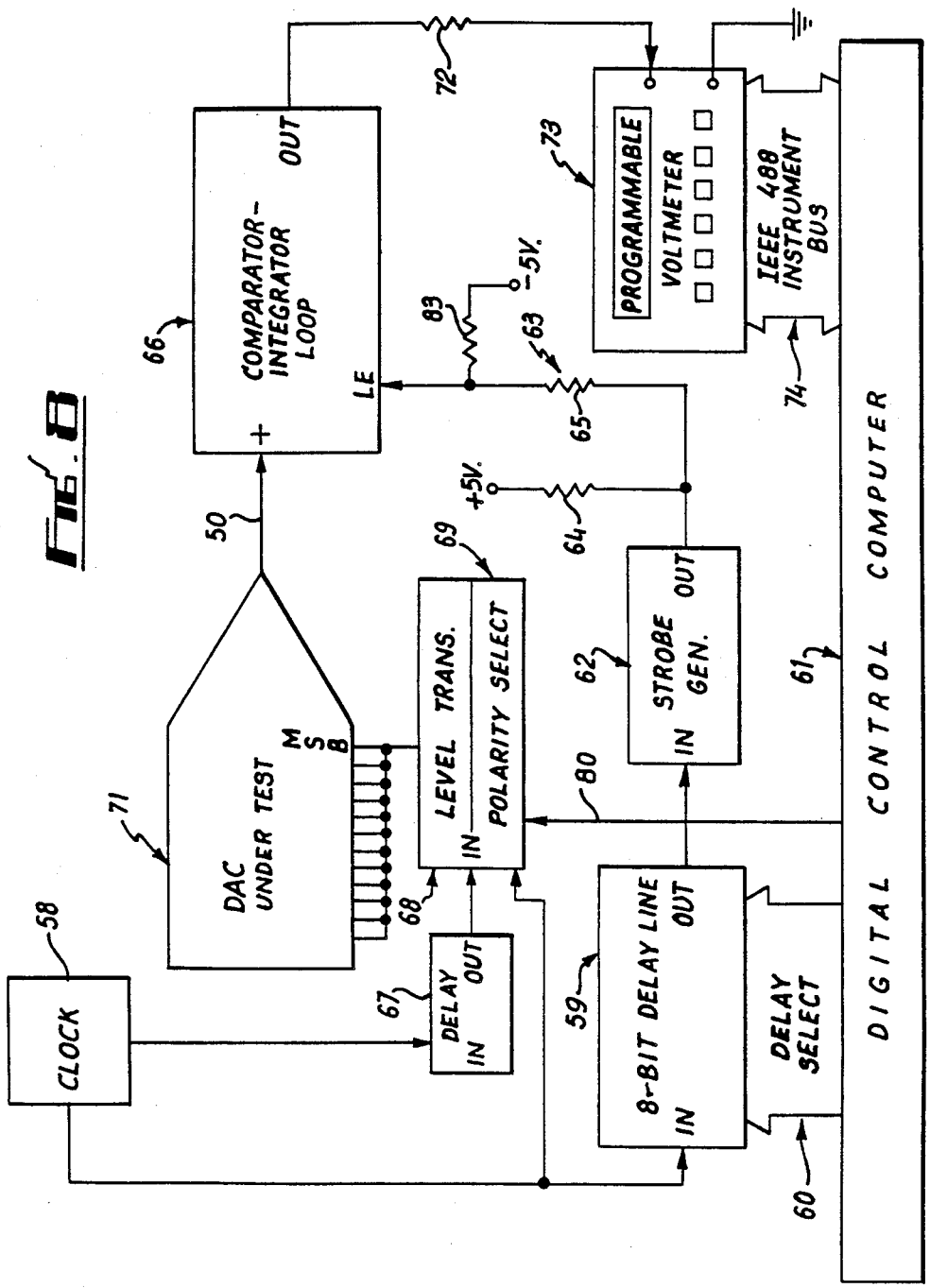
FIG. 8 is a block diagram of an automated tester used for measuring the settling time of a 12 bit DAC whose current mode output reaches ½ LSB accuracy in under 40 nanoseconds.

FIG. 8 is a block diagram of one application of the sampling waveform digitizer of the present invention used for measuring the settling time of a 12 bit digital-to-analog converter (DAC) whose current mode output reaches ½ LSB accuracy in under 40 nanoseconds. In the block diagram of FIG. 8, a clock 58 supplies clock signals to the input of an 8-bit delay line 59. The 8-bit delay line 59 also receives computer control signals from the digital computer 61 via the delay select portion 60. Once the computer controlled delay is selected, the output of the 8-bit delay line 59 is supplied to the input of a strobe generator 62 whose output is supplied to a TTL to ECL level translator network 63 which includes a first resistor 64 having one terminal connected to the output of a strobe generator 62 and the opposite terminal connected to a +5 volt source of potential, and a second resistor having one terminal connected directly to the output of the strobe generator 62 and the second terminal connected to the latch enable input of the comparator-integrator loop of block 66, as hereinafter described.

Concurrently, the clock 58 supplies clock signals to the input of a delay means 67 whose output is supplied to the input of a polarity select block portion 69 which also receives a computer command signal from the digital computer 61 via lead 80. The output of the polarity selector is supplied to the input of a level translator system 68 whose output is used to control the DAC under test 71. The output of the DAC under test 71 is supplied via lead 50 to the input of a comparator-integrater loop 66 and after the previously described repeated samples are strobed and equilibrium condition is attained, the final value is outputted through resistor 72 to the input of a programmable voltmeter 73. The output of the programmable voltagemeter 73 is a digital equivalent of the analog input final value. This digital equivalent is transferred to the digital control computer 61 for storage and further processing through an IEEE 488 instrument bus 74. The details of the blocks of FIG. 8 are broken down in the circuits of FIGS. 9 and 10, as hereinafter described.

Figure 10:
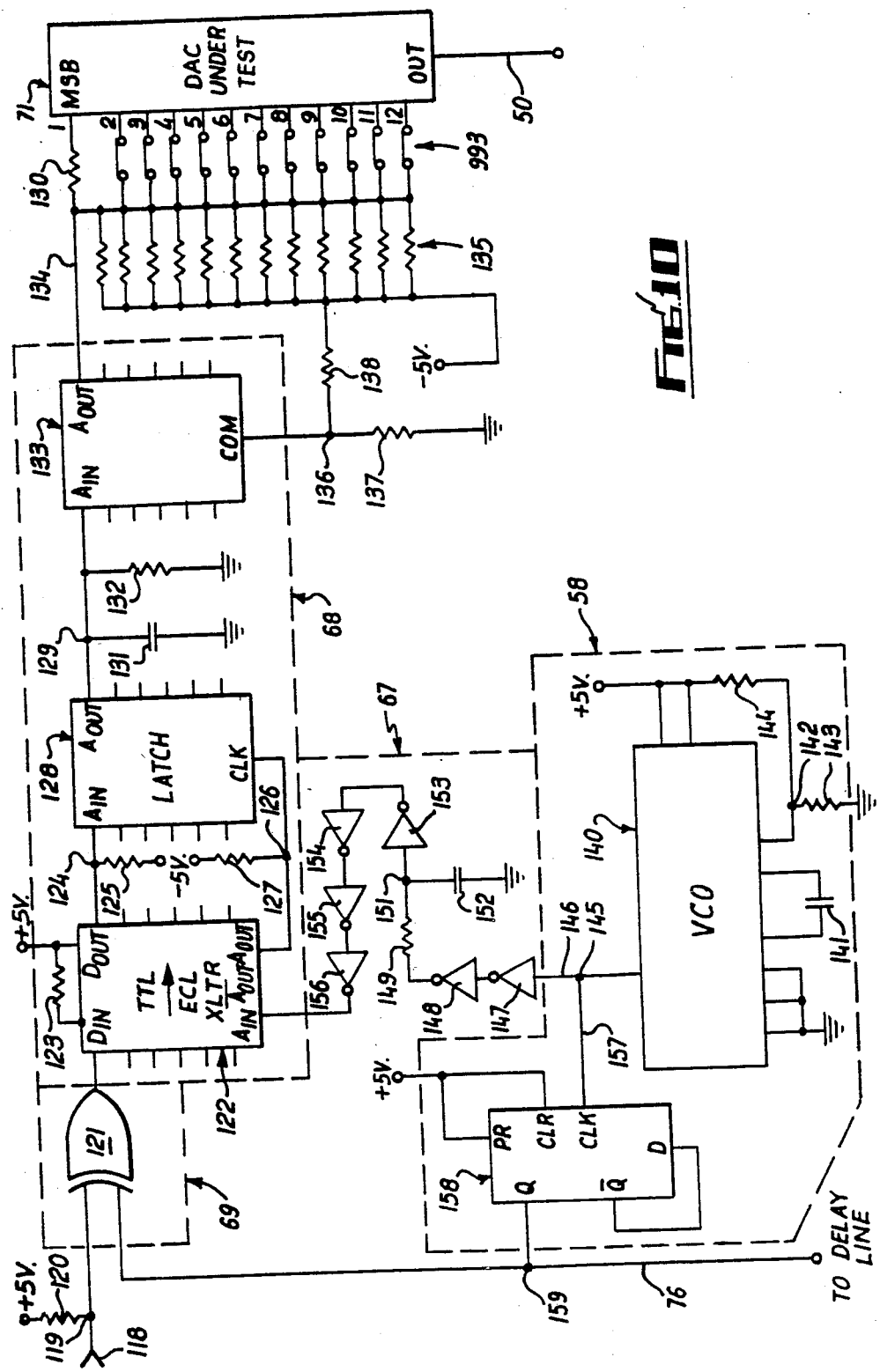
FIG. 10 is a partial block diagram, partial electrical schematic diagram of the clock, the delay, the level translation and polarity selection circuitry of the block diagram of FIG. 8.

FIG. 10 shows the circuitry within the polarity select block portion 69, the level translation block portion 68, the DAC under test block 71, the block 58, and the delay circuit 67 of FIG. 8. The clock of block 58 includes a voltage controlled oscillator (VCO) 140 which may be, for example, a type 74LS324 voltage-controlled oscillator such as that manufactured by Texas Instruments, Incorporated. The VCO 140 has its three ground inputs operatively coupled to ground; the CX1 pin connected to the CX2 pin through a capacitor 141; and the range pin and frequency control pin commonly coupled to a node 142 which is coupled to ground through a resistor 143. The node 142 is also coupled to a +5 volt source of potential through a resistor 144 and the 2 $V_{cc}$ inputs are commonly coupled to the +5 volt source of potential as well. The VCO output is taken from the enable output pin Y and connected directly to an output node 145.

The VCO 140 is actually a pair of independent voltage controlled oscillators in a single monolithic chip, each having complementary outputs. The output frequency of each VCO is established by a single external component, either a capacitor or a crystal, in combination with the voltage-sensitive inputs, one for frequency control and another for frequency range. These inputs can be used to vary the output frequency by changing the voltage applied to them. The highly stable oscillator can be set to operate at any normal frequency. In the preferred embodiment of the present invention, the voltage controlled oscillator 140 is set to operate at approximately 1 MHz. The output signals from the VCO output node 145 are connected via lead 157 to the clock input of a D-type flip-flop 158 having its preset input and clear input operatively coupled to a +5 volt source of potential and its D input and Q output operatively coupled together. The Q or non-inverting output of the flip-flop 158 is supplied to the flip-flop output node 159 which supplies the modified clock signals via lead 76 to the delay line circuitry of FIG. 9 and via lead 161 to one input of the polarity select circuit 69.

The polarity select circuit 69 includes a logical Exclusive OR gate 121 having two inputs and a single output. The first input of the Exclusive OR gate 121 is operatively connected to receive the modified clock pulses, which results from the clock pulses being divided by two by the flip-flop, via lead 161 while the other input is connected of an input node 119. Node 119 is connected through a resistor 120 to a +5 volt source of potential and to an input 118 from the digital computer 61 for supplying a digital select command under program control so that the polarity of the DAC switching is selectively controlled by said computer. The output of the Exclusive Or gate 121 is connected to the $D_{in}$ input of the first stage of the level translation circuitry 68 of FIG. 8.

The first stage of the level translation circuitry 68 includes a TTL to ECL translator 122 which may be, for example, a conventional unit such as a MC10124 TTL to MECL translator manufactured by Motorola, Inc. The translator 122 is used for interfacing data and control signals between a saturated logic section and the MECL section of digital systems. The translator 122 has TTL compatible inputs and MECL complimentary open-emitter outputs. When the common strobe input to the device is a low logic level, it forces all true outputs to a MECL LOW logic state and all inverting outputs to a MECL HIGH logic state. The advantage of the translator 122 is that TTL level information can be transmitted differentially, via balanced twisted pair of lines, to the MECL equipment where the signal can be received for further processing.

The $D_{in}$ input is taken from the output of the Exclusive OR gate 121 and the $D_{out}$ output is connected directly to an output node 124. The $V_{cc}$ input is connected directly to a $+5$ volt source of potential while the common strobe input is connected through resistor 123 to a $+5$ volt source of potential. The translator 122 also includes a $A_{in}$ input and a $A_{out}$ output as hereinafter described.

The output of the VCO 140 at 145 supplies the clock signals via lead 146 to the input of a delay netweork 67. The delay network 67 includes a first inverter 147 having its input operatively coupled to lead 146 and its output operatively coupled to the input of a second inverter 148. The output of inverter 148 is coupled to one terminal of a resistor 149 whose opposite terminal is coupled to a node 151. Node 151 is operatively coupled to ground through a capacitor 152 and directly to the input of a third inverter 153. The output of the third inverter 153 is connected to the input of a fourth inverter 154 and the output of the fourth inverter 154 is connected to the input of a fifth inverter 155. The output of the fifth inverter 155 is operatively coupled to the input of a sixth inverter 156 whose output is coupled directly to the $A_{in}$ input of the level translator 122 for providing a delayed clock signal thereto.

The $A_{out}$ output is operatively coupled directly to an output node 126 which is coupled directly to the clock input CLK of a latch circuit 128. The node 126 is also coupled to a $-5$ volt source of potential through a resistor 127. The $D_{out}$ output of the translator 122 is directly coupled to the node 124 and node 124 is directly coupled to the $A_{in}$ input of the latch 128. Node 124 is also coupled through a resistor 125 to a $-5$ volt source of potential.

In the preferred embodiment of the present invention, the latch 128 may be a conventional latch such as a MC10176 Hex "D"-master-slave flip-flop manufactured by Motorola, Inc. The latch contains six relatively high speed master-slave type "D" flip-flops. Clocking is common to all six flip-flops and data is entered into the master when the clock is low. The master-to-slave data transfer takes place on the positive-going clock transition. Therefore, the outputs may change state only on a positive-going clock transition. A change in the information present at the data input will not affect the output information any other time due to the master-slave construction of the device, as conventionally known in the art. Therefore, the signal present at node 126 is provided to the common clock input CLK of the latch 128 causing the data to be transferred from the input $A_{in}$ to the output $A_{out}$ on the positive-going clock transition. The output signal is supplied to output node 129 and node 129 is operatively coupled to ground through a capacitor 121 in parallel with a resistor 132.

The node 129 is also connected directly to the $A_{in}$ input of a buffer 133. The buffer 133 may be, for example, a conventional device such as a MC10197 HEX "AND" gate manufactured by Motorola, Inc. The buffer 133 provides a high speed hex logical AND function with strobe capability. The common input is connected directly to node 136 which is operatively coupled to ground through a resistor 137. Node 136 is also coupled through a resistor 138 the $-E$ volt terminal of a resistive pull-down network 135. The $A_{out}$ output of the buffer 133 is fed via lead 134 to a set of common nodes on the opposite terminal of the resistors of the network 135 from the terminal to which the $-5$ volt source of potential is coupled.

The device under test is a digital-to-analog converter (DAC) under test 71 which, in the preferred embodiment of the present invention, may be a conventional device such as a DAC63 manufactured by the Burr Brown Corporation of Tuscon, Ariz. The DAC under test 71 includes 12 bit resolution and accuracy, 35 nanosecond settling time, ECL compatible inputs, low glitch energy, an adjustable logic threshold for ideal switching, an internally by-passed supply line to minimize the settingly time, an internal feedback resistor for thermal tracking, and the like. The DAC 71 is an ultra-high fast settling 12-bit current output digital-to-analog converter where the inputs are ECL compatible and the outputs settle in 35 nanoseconds or less to within 0.012% of full scale range.

The output 134 from the buffer 133 is connected to the common nodes of the pull-down network 135 which are connected to the data inputs 2 through 12, while the first data input or the MSB input is operatively coupled to the common nodes through a resistor 130. By feeding the signal on lead 134 to the most significant bit through a resistor 130 and directly to the remaining bit positions 2 through 12, the entire DAC under test may be switched between 0 and full scale with the polarity selected by the computer 61 as previously described. The output from the DAC under test 71 is supplied via lead 50 to the comparator-integrater loop circuit 66 of FIG. 9. In the present system, the "D" flip-flop 158 may be a conventional device such as a LS74 dual D-type flip-flop manufactured by Signetics Corporation. The flip-flop 158 is a dual positive edge-triggered D-type flip-flop featuring individual data, clock, set and reset inputs and complimentary Q outputs, as conventionally known in the art.

Figure 9:
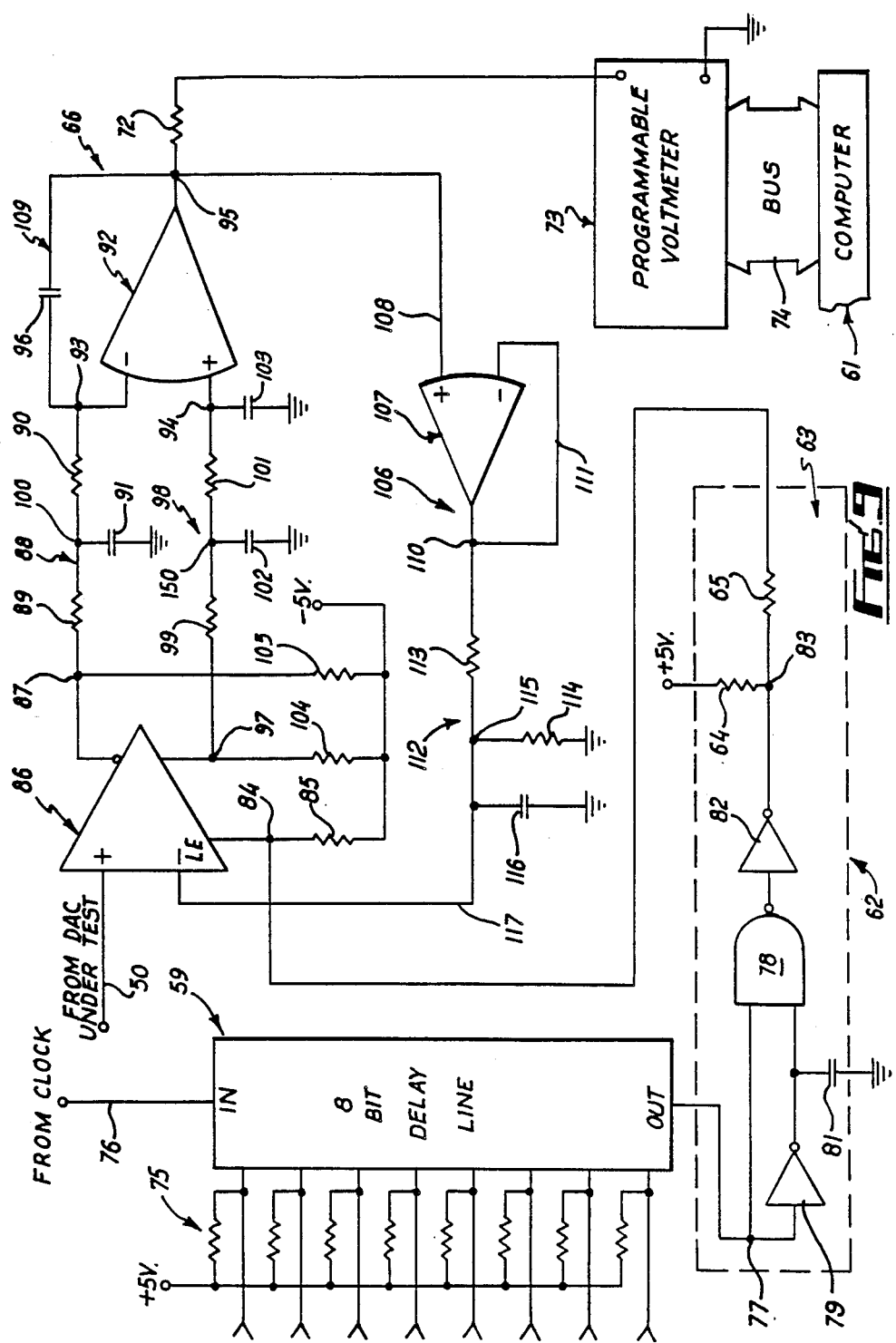
FIG. 9 is a partial block diagram, partial electrical schematic diagram of the 8 bit delay line, strobe generator, comparator-integrator loop, programmable voltagmeter, and bus of the block diagram of FIG. 8.

In the circuit of FIG. 9, the modified clock signal from node 159 is supplied via lead 76 to the input of an 8-bit programmable logic delay line. In the preferred embodiment of the present invention, the delay line 59 may be, for example, a low profile TTL compatible 8-bit programmable logic delay line such as a PTTLDL-20-1 manufactured by the EC$^2$ Engineered Component Company of San Luis Obispo, Calif. The 8-bit programamble logic delay line can be programmed by the presence of either a logical "1" or a logical "0" at each of the programming pins. Since the input and output terminals are fixed and programs accomplished only by DC voltage levels, programming may be accomplished by remote switching or permanent termination of the appropriate programming pins of the logic delay line to ground; the logic delay line may also be programmed automatically by computer generated data.

In the present circuit, the delay is controlled by the computer 61 using a general purpose parallel output port and a resistive termination network 75. The programmable delay line 59 has its output operatively coupled to an output node 77. The 8-bit programmable delay line 59 is adjustable from 0 to 255 nanoseconds in 1 nanosecond steps to determine the sample point. The differentiator is designed to produce a relatively narrow output pulse of 5 to 10 nanoseconds in width. The output node 77 is supplied to the input of the strobe generating circuitry 62 of FIG. 8 which includes a logical Nand gate having first and second inputs and an output, a first inverter 79, and a second inverter 82. The output node 77 is connected directly to one input of Nand gate 78 and to the input of a first inverter 79. The output of the inverter 79 is operatively coupled to ground through a capacitor 81 and to the second input of the Nand gate 78. The output of Nand gate 71 is supplied to the input of an inverter 82 and the output of inverter 82 is connected to a node 83 at the input of a level translation circuit 63. The level translation circuit 63 includes a resistor 64 operatively coupled between the node 83 and a +5 volt source of potential and a resistor 65 having one terminal operatively coupled to the node 83 and its opposite terminal connected to the latch enable input 84 of the comparator-integrator loop 66 of FIG. 8.

The strobe generator circuitry 62 and the output of the delay line 59 operate as follows. The rising edge of the delay line output is converted to a positive pulse (approximately 7 nanoseconds wide) through the TTL differentiator circuit including the NAND gate 78 and inverters 79 and 82. The TTL pulse from the output of the differentiator circuit 62 it is translated to ECL levels by the resistor network 63 where it is output as the comparator strobe signal or comparator strobe pusle for strobing the latch enable input of the latching comparator 86 of the comparator-integrator loop 66 as hereinafter described.

The comparator-integrator loop 66 of FIG. 9 includes a latching comparator 86 having a non-inverting signal input, an inverting reference input, a latch enable input, an inverting output, and a non-inverting output. The inverting output of the latching comparator 86 is connected directly to the inverting output node 87 which serves as the input to a T-filter network 88 as hereinafter described. Node 87 is connected to one terminal of a resistor 89 whose opposite terminal is connected to a node 100. Node 100 is connected to one terminal of a resistor 90 whose opposite terminal is connected to the inverting input node 93 of an operational amplifier 92. The operational amplifier 92 also includes a non-inverting input taken from a non-inverting input node 94 and an operational amplifier integrator output taken from node 95. An integrating capacitor 96 is operatively coupled between the inverting input at node 93 of the operational amplifier 92 and the operational amplifier output at node 95 for forming an integrator 109.

The non-inverting output of the latching comparator 86 is taken from the non-inverting output node 97 which also serves as the input of a second modified T-filter network 98 including a pre-filter network and a current control resistor. Node 97 is connected through a resistor 99 to a node 150 and node 150 is connected to ground through a capacitor 102. Node 150 is also connected to one terminal of a resistor 101 whose opposite terminal is connected to the non-inverting input node 94 which is also coupled to ground through a capacitor 103.

The latch enable input node 84 is directly connected to the latch enable input of the latching comparator 86 and is also connected through a resistor 85 to a −5 volt source of potential. Similarly, the inverting output node 87 and the non-inverting output node 97 of the latching comparator 86 are operatively coupled to the −5 volt source of potential through a first resistor 105 and a second resistor 104, respectively.

The integrator output node 95 is connected via lead 108 to the non-inverting input of an operational amplifier voltage follower 107 whose output is connected to an output node 110. The inverting input of the operational amplifier 107 is connected directly to the output node 110 through a feedback lead or path 111. Node 110 is connected to a voltage divider network 112 including a first resistor 113 having one terminal directly connected to the node 110 and its opposite terminal connected to a voltage dividing node 115. The voltage dividing node 115 is operatively coupled to ground through a second voltage divider resistor 114. A capacitor 116 is also connected in parallel with the second voltage divider resistor 114 between the voltage divider output node 115 and ground. The voltage divider output node 115 is connected by a lead 117 to the inverting or reference input of the latching comparator 86. The combination of the leads 108 and 113, the operational amplifier voltage follower 107, and the voltage divider network 112 form the feedback path 106 for completing the comparator-integrator loop 66 of FIG. 8.

In the preferred embodiment of the present invention, the latching comparator 86 may be, for example, a conventional deivce such as a Am685 voltage comparator manufactured by Advanced Micro Devices, Inc. The latching comparator 86 has an analog input stage which includes the latch enable input for clocking or sampling the signal present at the signal input and further includes output stages. The latching comparator 86 is a fast voltage comparator using advanced NPN, Schottky diode, high frequency components which make possible extremely short propagation delays without sacrificing the excellent matching characteristics heretofore associated only with slow high performance linear integrated circuits. The circuit has differential analog inputs and complementary logic outputs compatible with most forms of ECL. The output current capability is adequate for most applications and the low input offset and high resolution make this comparator especially suitable for high speed precision analog-to-digital processing. The latch functions provided allow the comparator to be used in a sample and hold mode. If the latch enable input is a logical HIGH signal, the comparator functions normally, but when the latch enable input is driven to a logical LOW, the comparator outputs are locked in their existing logical states.

The comparator strobe signals supplied from the strobe generator 62 to the latch enable input node 84 are used to clock or strobe the latching comparator 85 to sample the signal present at the signal input such as the signal waveform from the DAC under test on lead 50 from FIG. 10. The computer controls the sample time, a previously described, and the output is supplied to the operational amplifier and integrator loop 66 to appear at the integrator output node 95. The integrator output is fed back to the reference input of the latching comparator 86. The output of the latching comparator represents the sampled signal to be integrated.

The operational amplifier 92 is a conventional operational amplifier such as a OPA102 device manufactured by the Burr-Brown Corporation of Tucson, Ariz. Similarly, the operational amplifier voltage follower 107 is a conventional device such as a LM310 voltage follower manufactured by National Semiconductor, Inc.

The operation of the comparator-integrator loop 66 of FIG. 9 is identical to that previously described although a voltage follower and voltage divider with filter have been added. The operational amplifier voltage follower 107 buffers the output from the integrator at node 95 from signal disturbances which would normally result from the strobing of the latch enable input of the latching comparator 86 or from disturbances caused by the switching action of the latching comparator input. The voltage divider 112 comprising resistors 113 and 114 establish a voltage gain factor of approximately 10:1 for the overall comparator-integrator loop. The pulldown resistors 104 and 105 perform their conventional function and the T-filter means serves to round off signal spikes passing from the comparator output to the integrator input while controlling the current flow to the integrator and therefore the slope thereof for the integration process. The inclusion of the T-filter networks help make possible the improved accuracy necessary to enable the present system to perform as it does.

Once the feedback signal has forced the signal present at the reference input to oscillate about the sampled value of the test signal until an equalibrium state exists and the loop settles, the final value at node 95 is read via resistor 72 by the progammable voltmeter 73. The programmable voltmeter 73 is a conventional device such as a Hewlett Packard 3478A programmable voltmeter which is capable of receiving the analog signal indicative of the final value at node 95 and converting it into a digital equivalent. The digital equivalent is then transferred over an IEEE 488 instrument bus 74 to the digital control computer 61 for storage and subsequent processing and analysis, as desired.

The digital control computer 61 of the present invention may be any conventional digital computer such as a Hewlett Packard HP-85 manufctured by the Hewlett Packard Company. The computer enables the program control of the system operation including the generation of required computer control signals or commands, selection of the required delay time, storage and analysis of the digitized parameters, and the like. The programming of the digital computer 61 to perform the necessary functions described herein is obvious to anyone of ordinary skill in the art and the Hewlett Packaged HP-85 Owner's Manual and Progrmming Guide published in January of 1981 by the Hewlett Packard Company and incorporated by reference herein contains a more than adequate description to teach anyone how to perform the necessary programming.

In summary, the sampling signal digitizer for measuring the settling time of a 12-bit DAC whose current mode output reaches ¼ LSP accuracy in under 40 nanoseconds will be described. The circuit is significant since the testing of a current-mode DAC settling time has always been one of the most difficult masurements to make under any circumstances. The circuits of FIGS. 8, 9, and 10 show that a test stimulus signal is provided by the clock 58 and an 8-bit programmable delay line which is adjustable from 0 to 255 nanoseconds in 1 nanosecond steps is used for programming a computer-dictated delay using the general purpose parallel output port of the computer. The rising edge of the delay line output is converted into a positive pulse of approximately 7 nanoseconds width through the TTL differentiator circuit 62 and then the TTL pulse resulting is translated to ECL levels with a resistor network 63 to generate the comparator strobe signals.

The original clock signal is also used to switch the DAC under test between 0 and full scale, using a polarity selected by the computer through a polarity select circuit. To insure the comparator can sample at the actual transition time of the DAC, a delay circuit is used. This compensates for the built-in strobe delay. The computer can thus calibrate itself to the "time zero" point of the DAC output waveform by digitizing both before and after the transition.

The 0–10 aM DAC output is converted to a voltage by its own ohm output impedance so that the value of the least significant bit is roughly ten times greater than the minimum system resolution.

The form of the comparator-integrator feedback loop 66 could include a "T"-filter network which isolates the comparator reference input from the integrator output. This is required to prevent the comparator input, which switches on and off at the clock frequency, from causing a disturbance at the integrator output. The DC output is sent to a digital volt-meter which communicates with the computer 61 over the standard instrument bus 74.

Figure 11:
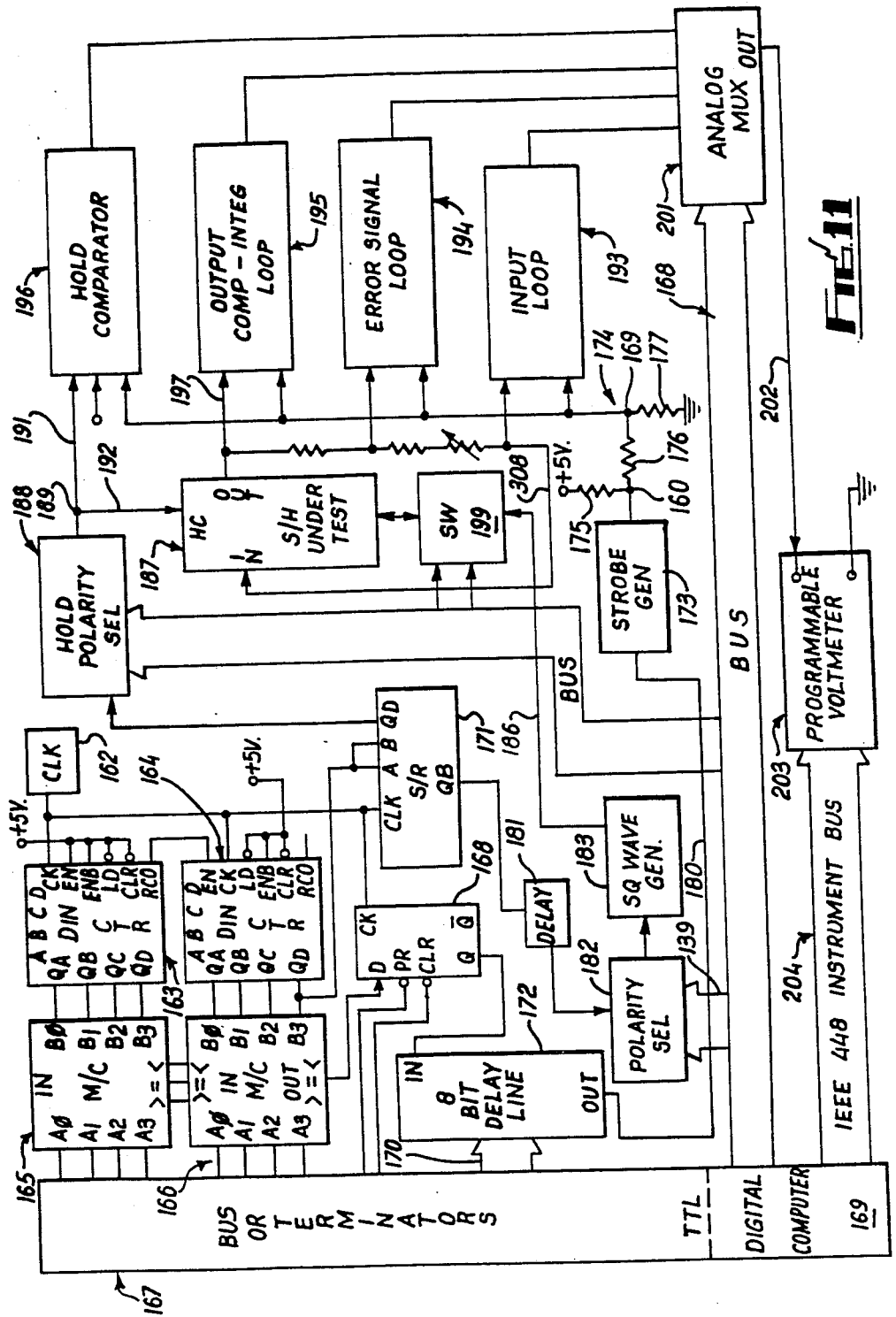
FIG. 11 is a block diagram of the dynamic tester for sample and hold amplifiers which measures acquisition time, sample-to-hold settling time, aperture delay, glitch amplitude, and slew rate, and the like of the present invention.

Another adaptation of the waveform sampling digitizer system of the present invention is used in the implementation of a dynamic tester for sample and hold amplifiers which measure acquisition time, sample-to-hold settling time, aperture delay, sample-to-hold offset, hold mode feedthrough rejection, slew rate, risetime, and the like. A block diagram of the sample/hold tester system which extends the capabilities of the basic digitizer of the present invention is shown in FIG. 11. The block diagram of FIG. 11 shows the user of three separate comparator-integrator loops: one each for input, output and amplifier error signal (false summing node). A fourth latching comparator, without an integrator, is used to detect the exact timing of the hold-to-sample and sample-to-hold transitions at the hold command input.

The block diagram of FIG. 11 includes a clock 162 for supplying clock pulses to a first and second 4-bit counter 163 and 164, respectively. The outputs of the counter 163 are operatively coupled directly to corresponding inputs of a 4-bit magnitude comparator 165 whose opposite inputs are set by the parallel digital computer 169 and supplied via bus 167 or by a general I/O port to the corresponding inputs of the first magnitude comparator 165. Similarly, the second 4-bit counter 164 has its outputs operatively coupled to a first set of inputs of a second r-bit magnitude comparator 166 whose opposite set of inputs is taken from the bus 167. When the magnitude comparators 165, 166 determine that the count of clock pulses stored in the counters 163, 164 is equal to the computer determined count, the equality output supplies a signal indicative of the equality thereof to the "D" input of the flip-flop 168. The D-type flip-flop 168 has its clock input connected directly to the source of clock signals, its preset input and its clear input coupled to a +5 volt source through a resistive terminator netweork of the digital computer.

The non-inverting Q output of the D-type flip-flop 168 is connected directly to the input of the 8-bit delay line 172 whose delay period is set via programmed control from the digital computer 169. The output of the 8-bit delay line 172 provides the input for the strobe generator circuit 173 whose output is supplied to the pull-down network 174 comprising a node 160 at the output of the strobe generator operatively coupled to a source of potential through a resistor 175. The node 160 is also coupled through a resistor 176 to a node 169 and node 169 is coupled to ground through a resistor 177 and via lead 174 supplies the strobe signals for clocking the latch enable input of each of the latching comparators of the circuits of block 193, 194, 195, and 196, as hereinafter described. When a predetermined count is reached, the $Q_D$ output of the counter 164 supplies a signal to the A and B inputs of a shift register 171. When a first time is reached, the $Q_B$ output of the shift register supplies a signal to the delay network 181 and after the signal is delayed it is supplied to the polarity select circuit 182 along with command control information from the computer 169 via data bus or output ports 139 respectively. Once the computer establishes the polarity of the test stimuli or square wave signal, the output indicative thereof is supplied of the input of a square wave generator 183 which generates a square wave pulse sequence and supplies the output to node 184. Node 184 connects the square wave pulses to the S/H under test 187 via lead 186.

Simultaneously, when the shift register 171 outputs a signal from its $Q_D$ output, the hold polarity select circuitry of block 188 which receives hold polarity select commands from the computer via bus 168, causes the hold polarity select circuit 188 to output a signal to output node 189. The signal at node 189 is supplied via lead 191 to one input of a hold comparator 680 as hereinafter described, and the signal at node 189 is also connected via lead 192 to the hold command input HC of the S/H under test 187. The output of the sample and hold amplifier S/H under test 187 is supplied via lead 197 to an input of the output comparator-integrator loop 195 as hereinafter described, while a lead 198 is taken from a false test node is supplied to the error signal comparator-integrator loop 194 as hereinafter described.

The comparator-integrator loop 193, 194, and 195, operate as previously described and once the equilibrium state is reached and the loop settles, the integrated analog final value is supplied through an input of an analog multiplexer circuit 201 under command of the computer 169 via bus 168 to output the selected final signal via lead 202 to the input of a programmable voltmeter 203 which performs an analog-to-digital conversion and supplies the digital equivalent of the final signal value to the digital computer 169 via IEEE 488 instrument bus 204.

In the preferred embodiment of the present invention, the counters 163 and 164 are conventional 4-bit counters such as a conventionally used 74LS163 device manufactured by Texas Instruments, Incorporated of Dallas, Tex. Each of the 4-bit counters 164 is a synchronous pre-settable counter featuring an internal carry look-ahead for application in high speed counter designs, and each is a 4-bit binary counter. Synchronous operation is provided by having all flip-flop clocked simultaneously so that the output's change is coincident with each other when so instructed by the count-enable inputs and internal gating. This mode of operation eliminates the output counting spikes normally associated with asynchronous counters. A buffered clock input triggers the 4 flip-flops on the rising or positive-going edge of the clock input waveform and the counters are fully programmable so that their outputs may be preset to either level.

Similarly, in the preferred embodiment of the present invention, each of the magnitude comparators 165 and 166 includes a conventional 4-bit magnitude comparator such as a 74LS85 device manufactured by Texas Instruments, Incorporated of Dallas, Tex. The 4-bit magnitude comparators perform the comparison of straight binary and straight BCD codes and 3 fully coded decisions about two 4-bit words are made and are externally available at three separate outputs.

The 8-bit delay line 172, the D-type flip-flop 168, the latching comparators and operational amplifiers used in the comparator-integrator loops 193, 194, and 195, and the latching comparator in the hold comparator of block 196, as hereinafter described, are identical to those previously used. Furthermore, the programmable voltmeter used for analog-to-digital conversion, the bus, parallel and/or serial parts, and the digital computer can be identical to those previously described. The shift register 171 can be a conventional 8-bit parallel-out serial shift register such as a type 74LS164 manufactured by Texas Instruments, Incorporated of Dallas, Tex. The shift register 171 is an 8-bit shift register featuring gated serial inputs and an asynchronous clear input. The gated serial inputs permit complete control over incoming data as a LOW at either or both inputs, inhibit entry of new data, and reset the first flip-flop to the LOW level at the next clock pulse. A HIGH level input enables the other input, which will then determine the state of the first flip-flop. Data at the serial inputs may be changed while the clock is HIGH or LOW but only information meeting the setup requirements can be entered. Clocking occurs on the LOW-to-HIGH level transition of the clock input, and all inputs are diode-clamped to minimize transmission line effects.

Lastly, the analog multiplexer 201 of FIG. 11 may be a conventioal MPC-8S CMOS analog multiplexer such as that manufactured by the Burr-Brown Corporation of Tucson, Ariz. This is a single ended monolithic 8-channel analog multiplexer with the digital and analog inputs protected from overvoltage that exceed either power supply. These CMOS devices feature self-contained binary channel address decoding and are compatible with DTL, TTL, or CMOS input logic levels.

Briefly summarizing the operation of the sample/hold tester of the block diagram of FIG. 11 before the detailed schematic diagrams of FIGS. 12, 13, 14, and 15 will be made. The sample/hold tester greatly extends the capabilities of the basic digitizer previously described by employing three separate comparator-integrator loops, one each for input, output and amplifier error signal (false summing node). A fourth latching comparator, without an integrator, is used to detect the exact timing of the hold-to-sample and sample-to-hold transitions at the hold command input of the device under test.

All comparators are latched simultaneously by the variable delay circuit which is programmable in 1 nanosecond increments from 0 to 64 microseconds. The exact value of the delay is set by placing a 16-bit control word on one of the computers parallel output ports. The timing circuit uses a 4 MHz crystal-controlled clock to allow 256 "course" delay signals from 0 to 63.75 microseconds. The clock signal increments an 8-bit binary counter every 250 nanoseconds. The counter value is continuously compared with the upper 8-bits of the "delay select" word from the computer. When the two numbers are equal, the output of the 8-bit magnitude comparator goes HIGH. This rising edge is sent through the 0 to 255 nanosecond delay line, which adds the "fine" delay value as selected by the lower 8 bits of the 16-bit control word. The delay signal is then converted to the comparator strobe pulse by a differentiator/ level shifter circuit similar to the one previously described for the DAC tester.

The test stimulus signal is created by dividing the four MHz clock frequencies by a factor of 256 giving a square wave with a period of 64 microseconds. The sample/hold itself is driven by a fast settling square wave generator which converts TTL levels to plus or minus five volts. The generator can be set under software control to follow the test stimulus, to invert it, or to ignore it. In the last case, the generator output can be fixed at +5 volts DC for observing the final value.

The TTL hold command signal is controllable in the same way as the square wave generator output, except that it is delayed 500 nanoseconds through a shift register 171. By independently controlling the polarities of the square wave generator and the hold command signal, the tester can be configured to measure many circuit parameters and conditions.

For acquisition time measurements, the familiar "false summing node" method is used. Because this technique produces the error signal of the internal amplifier in the sample/hold, it automatically compensates for slow settling tails in the signal generator. This is convenient, since the sample/hold under test 187 is based on an inverting amplifier principle. However, it should be noted that non-inverting amplifiers and sample/holds can be measured just as accurately by digitizing both input and output signals. In that case, software calculations would compensate for any imperfections in the test signal generator.

Acquisition, sample-to-hold settling, and aperture delay are defined with respect to the time of the hold command transition. Therefore, the hold command signal is fed to a latching comparator 196 whose reference input is tied to a 1.4 volt reference, the TTL switching threshold. The voltmeter reads the comparator output directly and no integrator is required because the shape of the waveform is not critical.

In searching for the exact time of the signal transition, the computer operates on a "successive approxmation" fashion. First, the comparator is strobed at a particular time point and its output is digitized. Next, a different time point is selected. If the comparator output switches, the computer tries a value midway between the first two. The process continues until the switching time point is found and all subsequent measurements are referred to that value.

Figure 12:
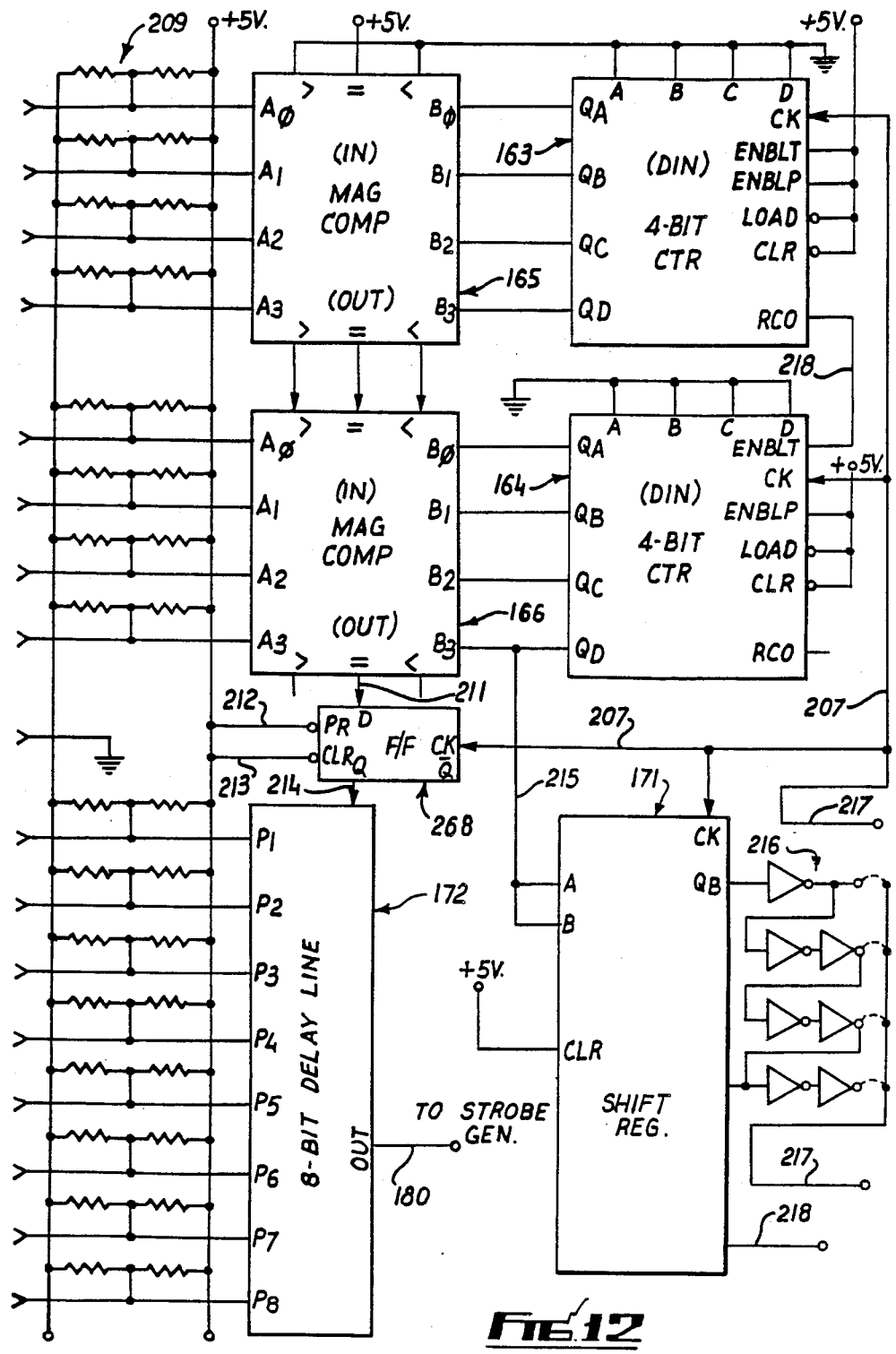
FIG. 12 is a partial block diagram, partial schematic diagram of the magnitude comparators, 8 bit counters, 8 bit delay line, flip-flop, shift register, and delay circuitry of the block diagram of FIG. 11.
Figure 13:
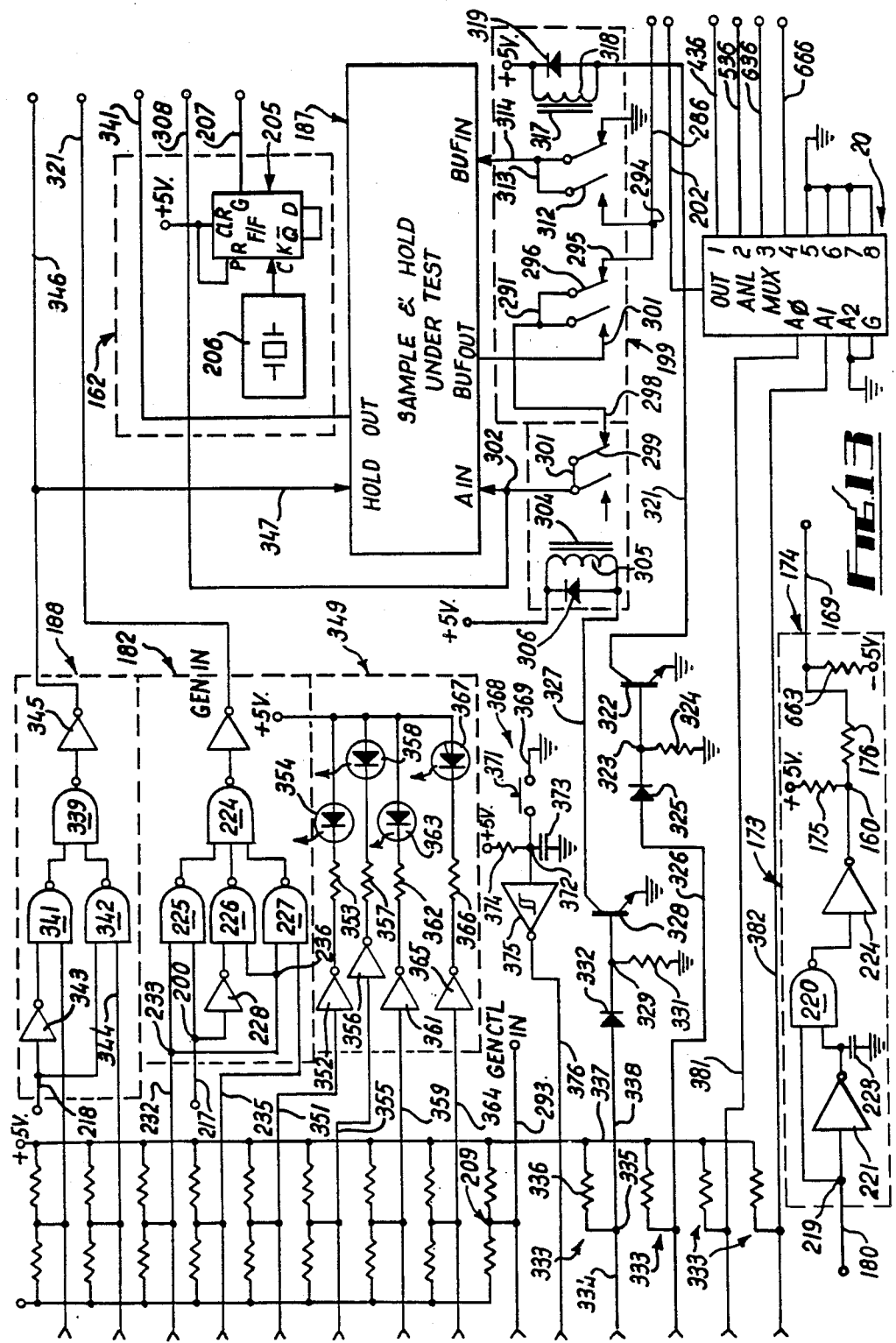
FIG. 13 is a partial block diagram, partial schematic diagram of the square wave generator, polarity select circuitry, hold polarity select circuitry, stroke generator cricuitry, level translation circuitry, clock circuitry, sample and hold under test device, switching circuitry, analog multiplexer circuitry, start test circuitry, and indicator circuitry of the block diagram of FIG. 11.

FIG. 13 illustrates the clock 162 of FIG. 11 as including a crystal-controlled oscillator 206 whose output is supplied to the clock input of a D-type flip-flop 205. The D input is coupled directly to the inverting Q output while the clear input and present input are coupled directly to a +5 volt source of potential. The non-inverting output Q supplies the clock signals to the circuit of FIG. 12 for use as indicated below.

FIG. 12 shows the clock signals arriving via lead 207 from the clock output of FIG. 13. Lead 207 supplies the clock signals to the clock inputs of first and second 8-bit binary counters 163 and 164, respectively. The counters will count clock pulses and the count will be represented as a 4-bit binary word at each of the counter's 4 outputs. These outputs are supplied directly to a corresponding 4 inputs of the magnitude comparators 165 and 166, respectively. The magnitude comparators are programmed to receive the upper 8 bits of a 16-bit program controlled delay word from the computer 169 through termination resistor network and corresponding inputs 209. The magnitude comparators will continually compare the command word presented by the computer at its first set of inputs with the count in the 4-bit binary counters 163 and 164 respectively, and when the values are equal, the magnitude comparator 166 will generate an output signal on the equality output via lead 211 to the D input of a D-type flip-flop 168.

The clock input of the flip=flop 168 receives the clock pulses from clock 162 via lead 207 and both the preset and clear inputs of the D flip-flop 168 are commonly coupled to a +5 volt source of potential. The Q output of the flip-flop 168 supplies an output signal on lead 214 to the input of an 8-bit delay line 172. The 8-bit delay line 172 is pre-programmed with the lower 8 bits of the 16-bit computer delay select word and performs the necessary "fine" adjustment to the delay signal. The output of the 8-bit delay line 172 is supplied to the strobe generator circuitry of FIG. 13 via lead 180.

Simultaneously, as the second 4-bit counter 164 reaches a count changing the value at the $Q_D$ output, lead 215 will transfer the signal to both the A and B inputs of the shift register 171. The clear input to shift register 171 is directly coupled to a +5 volt source of potential and when the $Q_D$ signal changes state, a signal is outputted to the input of a manually adjustable delay network 216 comprising a plurality of serially connected inverter gates, the exact number of which can be selected to control the output delay present on output lead 217. Similarly, when the $Q_D$ output of the shift register 171 changes state, an output signal will be transmitted via lead 218 to the hold polarity select circuit 188 of FIG. 13.

FIG. 13 shows a strobe generator circuit 173 and level-shifting circuit 174. The strobe generator circuit 173 receives the output signal from the 8-bit delay line 172 via lead 180 and supplies it to an input node 219. Node 219 supplies the signal to one input of a two input logical Nand gate 220 whose second input is coupled to ground through capacitor 223. The signal at node 219 is also supplied to the input of an inverter 221 and the output of the inverter 221 is connected directly to the second input of Nand gate 220. The output of the Nand gate 220 is connected to the input of an inverter 224 and the output of the inverter 224 represents a relatively narrow pulse which is fed to the pull-down circuitry 174 at input node 160. Node 160 is connected to a +5 volt source of potential through a resistor 175 and through a resistor 176 to an output lead 169. The output lead 169 is connected to an input of the circuitry of FIG. 14 as hereinafter described and used to supply comparator strobe signals to the latch enable input of each of the latching comparators of FIG. 14.

The polarity select circuitry of block 182 of FIG. 13 includes a first three input logical Nand gate 224, a first, a second, and a third, two-input logical Nand gate 225, 226 and 227, respectively, and a pair of inverters 228 and 229. A first input of the square wave polarity select network 182 is received from the digital computer 169 through a resistive termination network 209, as conventionally known in the art, and supplied via lead 232 to input node 233. Node 233 supplies the computer command signal to a first input of Nand gate 225. The same signal is supplied from node 233 to node 236 and thence to the first input of the Nand gates 226 and 227. the delayed signal from the $Q_B$ output of the shift register 171 of FIG. 12 is supplied via lead 217 to input node 200. Node 200 supplies the delayed signal to the second input of Nand gate 225 and to the input of inverter 228 whose output supplies the inverted signal to the second input of Nand gate 226. The second input of Nand gate 227 is connected directly to receive the computer command signal through termination network 209, and the outputs of each of the Nand gates 225, 226, and 227 are operatively coupled to the first, second, and third inputs of the Nand gate 224. The output of Nand gate 224 is connected to the input of an inverter 229 and the output of inverter 229 supplies the generator IN signal on lead 231 to the square wave generator circuit of FIG. 15, as hereinafter described.

Figure 15:
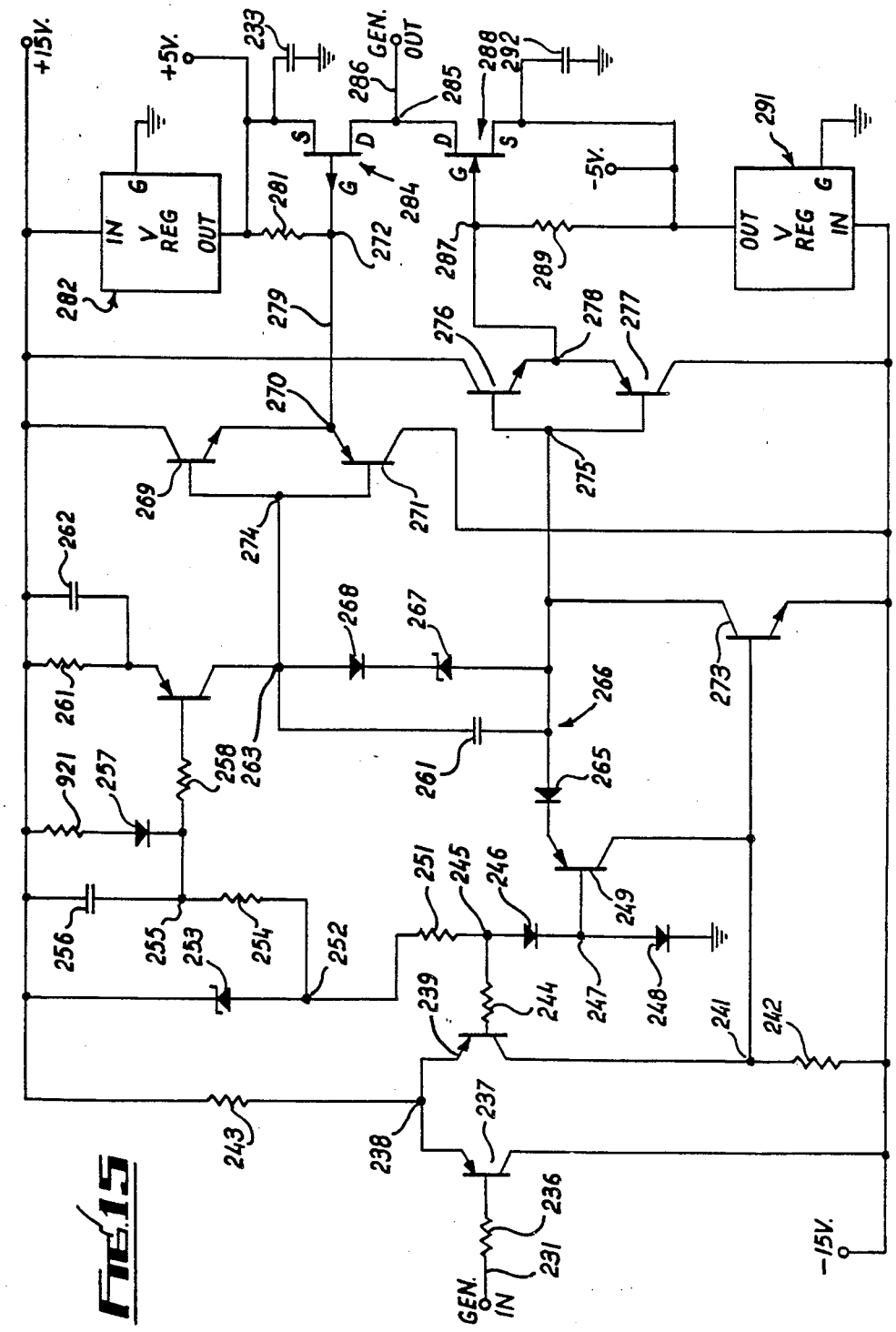
FIG. 15 is a schematic diagram of the square wave generator circuitry of the block diagram of FIG. 11.

FIG. 15 shows a square wave generator which may be used with the testing system of the present invention. The generator IN signal is supplied via lead 231 to one terminal of a resistor 236 whose opposite terminal is connected to the base of a PNP transistor 237 whose collector is connected directly to a −15 volt source of potential. The emitter of the PNP transistor 237 is connected to node 238 which commonly couples the emitter of transistor 237 to the emitter of a second PNP transistor 239. The collector of transistor 239 is connected directly to a node 241 and node 241 is connected to the −15 volt source of potential through a resistor 242. Node 238 is connected through a resistor 243 to a +15 volt source of potential as well.

The base of transistor 239 is connected through a resistor 244 to an output node 245. Node 245 is connected to the anode of a diode 246 whose cathode is connected directly to a node 247. Node 247 is connected to the anode of a second diode 248 whose cathode is connected directly to ground. Node 247 is also connected to the base of a PNP transistor 249 whose collector is connected directly to the −15 volt source of potential and whose emitter is operatively coupled to the cathode of a diode 265. The anode of diode 265 is connected directly to a node 266 and node 266 is connected through a capacitor 264 to a node 263. Node 266 is also connected to the anode of a zener diode 267 whose cathode is connected to the cathode of a diode 268 whose anode is connected to node 263. Furthermore, node 266 is connected to the collector of a NPN transistor 273 whose emitter is connected to the −15 volt source of potential and whose base is connected directly to node 241.

Node 245 is connected through a resistor 251 to a node 252 and node 252 is connected to the anode of a zener diode 253 whose cathode is connected to a +15 volt source of potential. Node 252 is also connected through a resistor 254 to a node 255 and node 255 is connected to the +15 volt source of potential through a capacitor 256. Node 255 is also connected to the cathode of a diode 257 whose anode is connected to the +15 volt source of potential and to one terminal of a resistor 258 whose opposite terminal is connected to a PNP transistor 269. The transistor 259 has its collector coupled directly to node 263 and its emitter coupled to the +15 volt source of potential through the parallel combination of resistor 261 and capacitor 262.

Node 263 is connected directly to node 274 and node 274 is connected to the base of an NPN transistor 269 whose collector is connected directly to the +15 volt source of potential. Node 274 also commonly couples the base of NPN transistor 269 to the base of a second PNP transistor 271 whose collector is connected directly to the −15 volt source of potential. The emitter of transistor 269 is connected directly to the emitter of transistor 271 and their junction is represented by node 270. Node 270 is connected via lead 279 to a node 272. Node 272 is connected through a resistor 281 to the output of a conventional, commercially available, voltage regulator 282 whose input is connected to the +15 volt source of potential. The regulated output is connected to a +5 volt source of potential and to ground through a capacitor 283. Furthermore, node 272 is connected to the gate of P-channel FET transistor 284 having its Source electrode directly coupled to ground through the capacitor 283 and its Drain electrode coupled to the common output node 285.

Node 266 is also connected to a node 275 which commonly couples the base of an NPN transistor 276 to the base of a PNP transistor 277. The collector of transistor 276 is connected directly to the +15 volt source of potential and the collector of the second transistor 277 is connected directly to the −15 volt source of potential. The emitter of the transistor 276 is directly connected to the emitter of transistor 277 and the junction is designated node 278. Node 278 is connected directly to a node 287 and node 287 is connected through a resistor 289 to the output of a commercially available, conventional, voltage regulator 291 whose input is connected directly to the −15 volt source of potential. The output of the voltage regulator is also coupled to a −5 volt source of potential and to ground through a capacitor 292. Node 287 is further connected directly to the gate of an N-channel FET transistor 288 having its Drain electrode coupled to ground through the capacitor 292 and its Source electrode coupled to the common output ndoe 285 so that either a +5 output or −5 output level square wave signal is supplied via lead 286 to a switching circuitry 199 associated with the S/H under test 187 of FIG. 13.

The square wave generator circuit of FIG. 15 is relatively conventional in operation and only a brief functional description will be given herein. The input lead 231 supplies a TTL logic level signal into a differential pair including the PNP transistors 237 and 239. Transistor 259 along with resistors 254, 258, 261, 921, capacitors 256, 262, and diode 257 form a current source. The transistor 249 and associated diodes form a clamp for preventing the current source from saturating. Zener diode 267 and diode 268 form a 10-7 volt voltage drop and both the first pair of opposite polarity transistors 268, 271 and the second pair of opposite polarity transistor 276, 277 form buffers for driving the input capacitance of the corresponding opposite polarity FETs 284, 288. Whenever the differential pair 237, 239 turn on the transistor 273, the buffer pair 276, 277 will maintain the FET 288 "off" and the buffer pair 269, 271 will drive FET 284 "on" so that a +5 volt output appears at output node 285. Alternately, when transistor 273 is switched off by the input signal, the buffer pair 269, 271 will maintain FET 284 "off" while the buffer pair 276, 277 will drive the FET 288 "on" so that a −5 volt signal appears at node 285, resulting in a square wave output.

The square wave generator output on lead 286 is supplied to the circuit of FIG. 13 to a node 294. Node 294 is connected to a contact 295 which is normally-closed on a moveable relay-operated switch arm 296 of the switch 297 which also includes a common normally-opened switch arm which can be closed on the Buffer Out switch contact 308, if desired. The output of the switch 297 is connected directly to a contact 298. A second relay-operated dual switch has its contact arm 299 normally closed on the contact 298 to complete a conductive path via the switch portion 301 to a node 302. Node 302 is connected directly to the Analog IN input of the sample and hold circuit under test 187.

A contact 304 is connected directly to ground and makes contact with the second one of the pair of moveable switch arms 302 when operated by the relay. The relay includes a transformer core 304, a coil 305, and diode 306 coupled with its anode at one end of the coil 305 and its cathode operatively connected at the other end of the coil and simultaneously to the +5 volt source of potential. The anode of doide 306 is connected via lead 227 to the collector a NPN transistor 328 whose emitter is grounded. The base of transistor 328 is connected to ground through a resistor 331 and to the cathode of a diode 332 whose anode is connected via lead 338 and a modified termination system 333, including an input lead 334, a node 335, and a resistor 336, the resistors being commonly coupled via lead 337 to the +5 volt source of potential. Hereinafter, the terminators will be simply referred to as inputs 333 or the like which are supplied from the digital computer 169.

Figure 14:
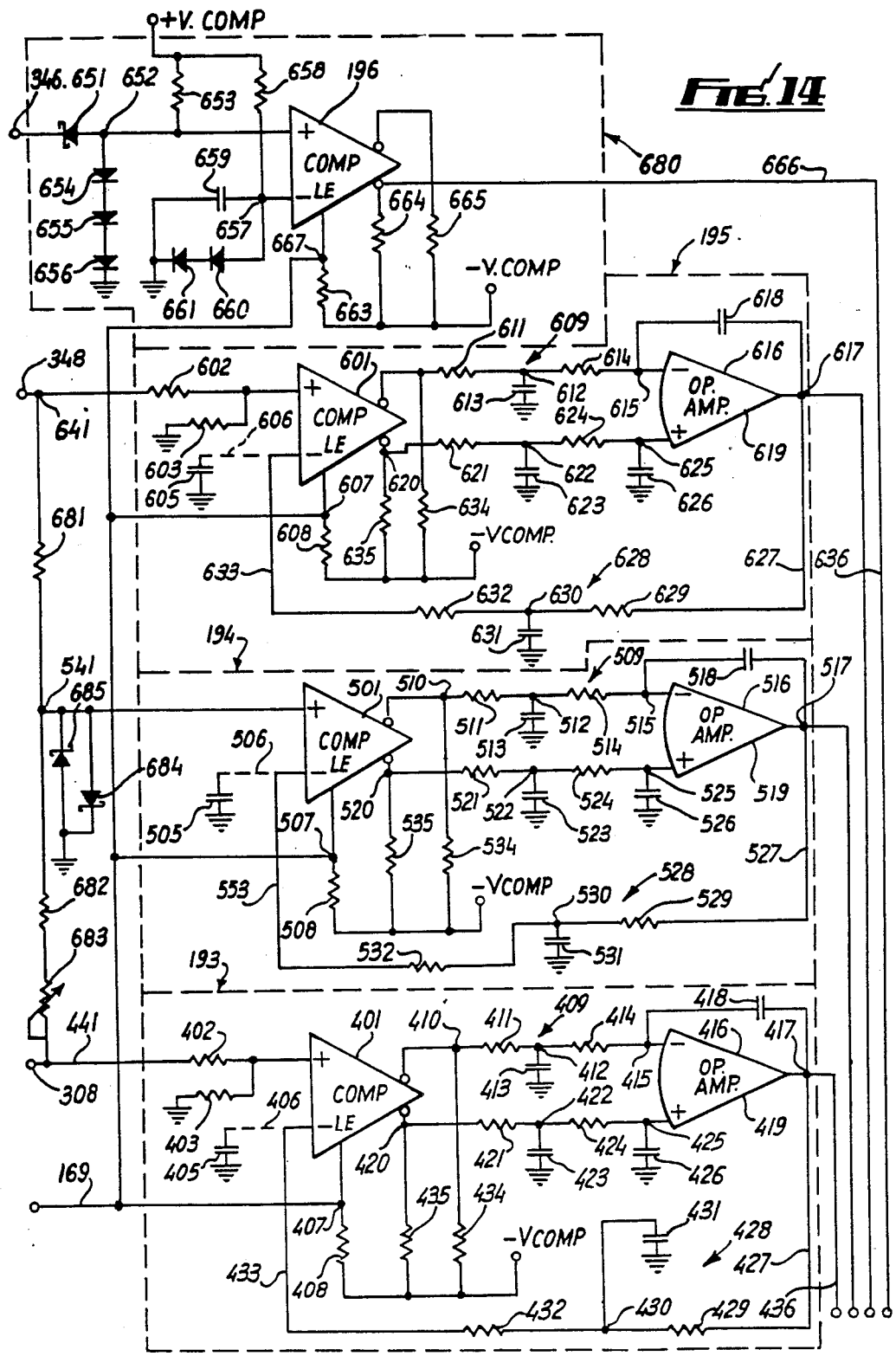
FIG. 14 is a partial block diagram, partial schematic diagram of the hold comparator circuitry, output comparator-integrator loop circuitry, error signal loop circuitry, and input loop circuitry of the block diagram of FIG. 11.

Furthermore, the switching network 199 of FIG. 13 includes a normally non-conducting contact 311 disposed opposite a normally opened moveable switch arm 312 whose opposite arm is designated switch member 315. The connection 313 between the pair of switch arms 315 and 312 is connected directly to the Buffer IN input of the S/H circuit under test 187. The circuit also inlcudes a core 317, a coil 318, and a diode 318 having its anode connected to one terminal of the coil 318 and its cathode connected to the opposite end of the coil 318 and to a +5 volt source of potential. A computer command input is supplied via the termination network 333 and lead 316 to the anode of a diode 325 whose cathode is connected to a node 323. Node 323 is connected to ground through a resistor 324 and to the base of a NPN transistor 322 whose emitter is grounded and whose collector is connected via lead 321 to the anode of diode 319 for controlling the operation of the relay controlled switching means together with the conduction of transistor 318 as previously described. Therefore, the position of the switching means determines whether or not the sample and hold circuit under test 187 receives the square wave generator output at the analog input or not, depending upon the computer commands. The lead 308 from the signal input of the comparator 401 of FIG. 14 is connected directly to the Ain node 302.

The hold polarity select circuitry 188 of FIG. 13 includes first, second, and third logical Nand gates 339, 341, and 342, each having two inputs and an output. The output signal delayed by the shift register and supplied from the output $Q_D$ via lead 218 of FIG. 12 is supplied via lead 218 to the input of an inverter 343 whose output is connected directly to one input of Nand gate 341. The signal on lead 218 is also connected directly to the first input of Nand gate 342. A computer control command is connected directly to the second input of Nand gate 341 and a second computer control signal is supplied via lead 344 to the second input of Nand gate 342. The output of Nand gate 341 is connected to one input of Nand gate 339 and the output of Nand gate 342 is connected to the second input of Nand gate 339. The output of Nand gate 339 is connected to the input of an inverter 345 whose output supplies the computer controlled S/H Select Signal to the circuitry of FIG. 14 via lead 346 as hereinafter described, and to the Hold Input of the sample/hold under test 187 via lead 347.

The circuit of FIG. 13 also includes a LED indicator circuit 349. A first computer command input is supplied via lead 351 to the input of inverter 352 whose output is connected through a resistor 353 to the cathode of a LED 354 whose anode is connected directly to a +5 volt source of potential for activating the LED 343 to emit light indicative of a "ready" condition. A second computer command input is connected via lead 355 to the input of an inverter 356 whose output is connected through resistor 357 to the cathode of a light emitting diode 358 whose anode is connected to the +5 volt source of potential for activating the LED 358 to emit light and indicate a "busy" status. A third computer command signal is supplied via lead 359 to the input of an inverter 361 whose output is connected through a resistor 362 to the cathode of a third LED 363 whose anode is connected to the +5 volt source of potential for activating the LED 363 to emit light whenever a "pass" condition exists. Lastly, a fourth computer command is supplied from the termination network 204 and lead 364 to the input of inverter 365 and the output of inverter 365 is connected through a resistor 366 to the cathode of a LED 367 whose anode is connected to a +5 volt source of potential for activating the diode to emit light whenever a "fail" condition is detected.

Lead 293 receives or represents a general control input or inputs which could be used for purposes other than those currently shown. The circuit of FIG. 13 also includes a "start test" system 368. The system 368 includes a grounded contact 369 and a second contact directly coupled to a node 372 with a switch closure member 371 in a normally-open position above the two contacts but operable for closing the contacts to complete a circuit path between ground and node 372. Node 372 is also connected to ground through a capacitor 373 and to a +5 volt source of potential through a resistor 374. Node 372 is connected to the input of a Schmitt trigger 375 whose output is connected via lead 376 to the computer system previously described. FIG. 13 also shows an analog multiplexer 301 having 4 inputs as hereinafter described, which are taken from the circuit of FIG. 14, and 1 output connected via lead 202 to the programmable voltmeter 203 of FIG. 11 as previously described, for analog-to-digital conversion and transmission of the digital value to the computer for storage, processing and analysis. A first computer command is also connected via lead 381 to one input of the analog multiplexer, while a second command is connected via lead 382 to a second input of the multiplexer 301 for controlling the operation thereof under computer-generated command.

The circuitry of FIG. 14 will now be described. The circuit of FIG. 14 includes first, second, and third substantially identical comparator-integrator loops, each of which is constructed substantially identical to that previously described with reference to the DAC testing system and which operates substantially the same. Therefore, only a brief description will be given of loop operation in FIG. 14.

The first comparator-integrator loop is designated an INPUT comparator-integrator loop which inlcudes a latching comparator 401. The input waveform is supplied via lead 308 from the resistive network coupling the signal inputs of latching comparators 501 and 601 and is connected through a resistor 402 to the non-inverting signal input of the comparator 401. The non-inverting input of the latching comparator 401 is also connected to ground through a resistor 403. The inverting input to the latching comparator 401 may or may not be connected through a capacitor 405 to ground as indicated by the dashed lead 406 from the inverting input to the capacitor 405. The latching comparator 401 includes a comparator strobing node 407 which receives the comparator strobe signals via lead 169 from the output of the circuit of blocks 174 and 174, respectively. The node 407 is also connected through resistor 408 to a $-V_{COMP}$.

The inverting output of the latching comparator 401 is supplied to the input of a modified T-filter network 409 via node 410 which includes a pre-filter and a resistor. Node 410 is connected through a resistor 411 to a node 412. Node 412 is connected to ground through a capacitor 413 and is connected to a node 415 through a resistor 414. Node 415 is connected directly to the inverting input of a conventional operational amplifier 416 having an operational amplifier output as indicated by node 417. An integrating capacitor 418 is operatively coupled between the inverting input node 415 and the amplifier output node 417 for forming an integrator 419.

The non-inverting output of the latching comparator 401 is connected directly to an output node 420 which serves as the input of a second modified T-filter network. Node 420 is connected through a resistor 521 to node 422, which is grounded through capacitor 423. Node 422 is also connected to a node 425 through resistor 424 and node 425 is grounded through a capacitor 426. The node 425 is connected directly to a non-inverting input of the operational amplifier 416 and a feedback path 427 is taken from the integrater output node 417 to another T-filter network 428. Filter network 428 has the lead 427 connected through a resistor 429 to node 420. Node 430 is connected to ground through capacitor 431 and node 430 is connected through resistor 432 and a feedback lead 433 to the inverting reference input of the latching comparator 401. A node 410 is connected to the signal $-V_{COMP}$ source of potential, as is the node 420 through resistor 434.

As previously described, the comparator strobe pulses are supplied via lead 269 to the node 407 and the latching enable input of the latching comparator 401 causing the samples to be taken of the input waveform at node 441. The signal present at the inverting output of the latching comparator 401 is integrated by the comparator 419 and the output signal appears at node 417. This signal is filtered and fed back to the reference input for forcing the reference signal to oscillate about the sampled value when equilibrium is achieved and the loop settles, at which time the signal appearing at the output node 417 may be taken as the "final value" and supplied via lead 436 to the analog multiplexer of 201 of FIG. 13 for subsequent analog-to-digital conversion and transfer to the computer.

The second comparator-integrator loop is designated as the Summing Node Error comparator-integrator loop and all common components receive reference numerals 100 numbers higher than those of the first comparator-integrator loop. The input is taken from node 541 and the output is supplied via lead 536 to the analog multiplexer 201. Similarly, the third comparator-integrator loop is designated as the "Output" comparator-integrator loop and its substantially identical components are designated by numbers 100 higher than those of the second comparator-integrator loop. Its input is taken from lead 348 and its output is taken from lead 536.

Lastly, the circuit includes a latching comparator 196 designated as a Hold Comparator 680. The comparator 196 receives the S/H Select Signal via lead 346 and supplies it to the cathode of a Schottky diode 651 whose anode is connected to a node 652. Node 652 is connected to a source of potential $+V_{COMP}$ through a resistor 653. Node 652 is also connected to the anode of a diode 654 whose cathode is connected to the anode of a diode 655 whose cathode is connected to the anode of a diode 656 whose cathode is grounded. This provides the input signal to the non-inverting input of the latching comparator 196. The inverting input is taken from node 657 which is operatively coupled to the source of potential $+V_{COMP}$ and to ground through a capacitor 659. Node 657 is also connected to the anode of a diode 660 whose cathode is connected to the anode of a diode 661 whose cathode is grounded. The pair of diodes 660, 661 are used to establish a 1.4 volt reference at the inverting input. The sampling node 662 receives the comparator strobe pulses via lead 169 to sample the input signal therein. The inverting output of the latching comparator 196 is connected through a resistor 665 to a source of potential $-V_{COMP}$ while the non-inverting output is connected through a resistor 664 to the source of potential $-V_{COMP}$. The non-inverting output is also connected via output lead 666 to supply the output signal to the analog multiplexer 201 of FIG. 13 for processing as previously described.

Figure 16:
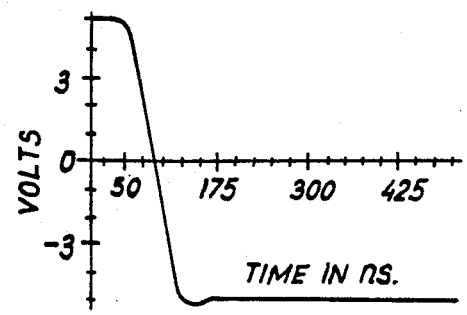
FIG. 16 represents a computer printout plot of the measured acquisition time characteristic in which $t=0$ corresponds to the hold-to-sample transition.
Figure 17:
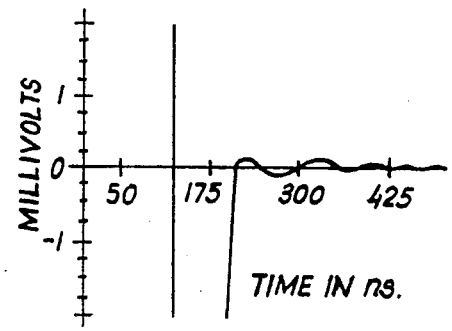
FIG. 17 shows the computer printout plot of the detailed settling characteristic as measured at the false summing node of the sample and hold amplifier under test.

FIG. 16 is a computer printout of the measured acquisition time characteristic in which $t-=0$ corresponds to the hold-to-sample transition. FIG. 17 shows the detailed settling characteristic as measured at the false summing node.

Figure 18:
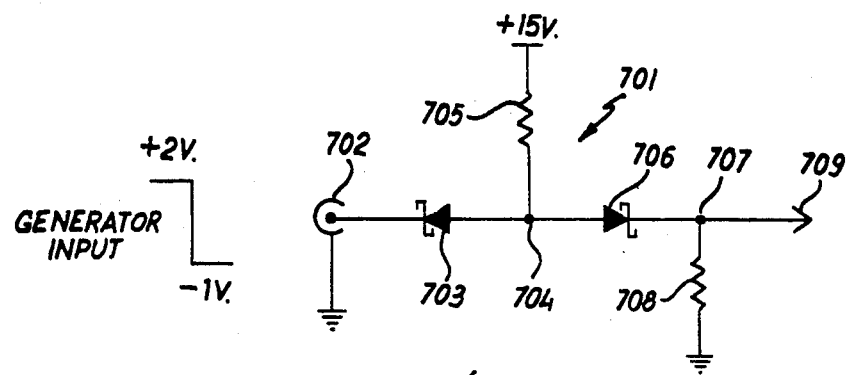
FIG. 18 is a Schottky diode network for generating a calibration standard to validate the testing results.

With any measurement technique, it is desirable to have a calibration standard to validate the results. Although it is impossible to generate a "perfect" voltage step (i.e., zero risetime and zero droop or ringing), a close approximation can be realized with a network of Schottky diodes as shown in FIG. 18. The generator input 702 is connected to the cathode of Schottky diode 703 whose anode is connected to a node 704. Node 704 is connected to a $-15$ volt source of potential through a resistor 705 and to the anode of a second Schottky diode 706. The cathode of the Schottky diode 706 is connected to a node 707 and node 707 is connected to ground through resistor 708 and to an output lead 709 to an oscilloscope or the like.

Using the Schottky diode network 701, the theoretical turnoff time of the network which is dominated by the RC time constant, may be calculated as follows:

$$C_{NODE} = C_{DIODE} + C_{COMPARATOR\ INPUT}$$

wherein $$RC = 200\ ohms \times 5\ picofarads = 1\ nanosecond$$

settling to a value of 200 microvolts for a 2 volt step (0.01% settling) requires that $V(t_s) = 200 \text{ microvolts} = V(0)(1 - e^{s/RC^t})$ Solving for this equation for $t_s$ gives $t_s = 9.7$ nanoseconds.

Figure 19:
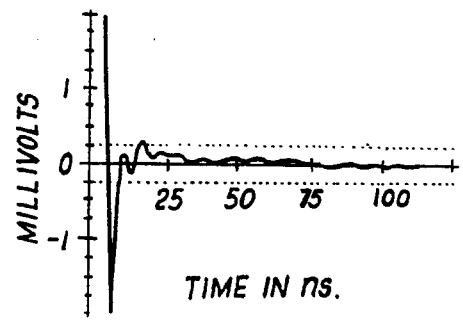
FIG. 19 is a computer plot of the waveform resulting from the Schottky diode turn-off waveform as measured on the digitizer system of the present invention.

In practice, the setting time is also affected by ringing due to lead inductance and imperfect grounds. FIG. 19 is a computer plot of the Schottky diode turnoff waveform as measured on the digitizer system. The measured settling time to +200 microvolts is within 7 nanoseconds of the theoretical value.

It is also important to determine the "final value". In the specification of settling time, it is important to be clear about the meaning of the term "final value". For example, an amplifier output may appear to settle very quickly to a particular error band when viewed in 1 to 10 millisecond time frame, but when observed over a period of milliseconds, it may also exhibit a thermally-induced "tail" which causes it to drift out of the prescribed error band. Whether or not the device can still be called a "fast steeling amplifier" depends on the particular application, but a rigorous definition of the final value would probably disallow such a claim.

For use with the present invention, there are two ways to determine the true value using the sampling waveform digitizer of the present invention. The first is simply to extend the maximum delay of the programmable time base to some reasonably large value, enough to allow thermal tails and other long-term effects such as dielectric relaxation of capacitors and the like to settle out. One consequence of extending the time base is that the repetitive sample pulses are spaced farther apart, requiring that the integrator output slope become very small to preserve system accuracy. In that case, the integration constant could be variable as described above.

A second way to determine the final value is to program the test stimulus generator for a DC output while still strobing the comparator repeatedly. Thus the device under test can reach its equilibrium state and the computer will read the DC final value after a programmed waiting time.

Again, the Schottky diode turn-off waveform network of FIG. 18 serves well to verify the final value measurement. The network settles exactly to the ground independent of heating effects in the diode or resistors.

Figure 20:
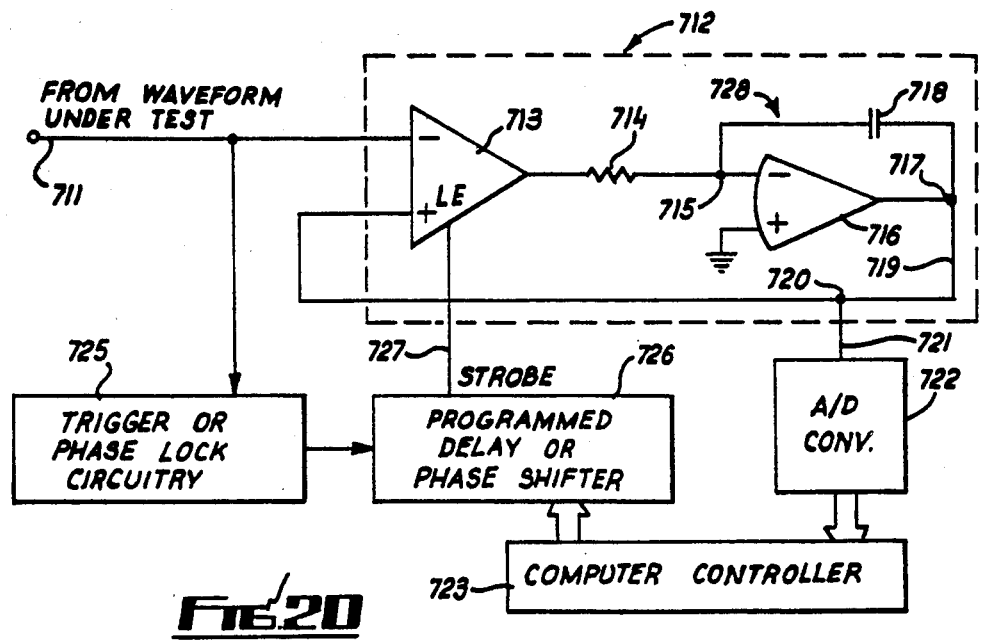
FIG. 20 is a broad generalized block diagram of an alternate embodiment of the sampling waveform digitizer contemplated by the present invention.

Future uses of the sampling waveform digitizer and variations thereof are numerous, and one such real time system is shown in the block diagram of FIG. 20. An external signal or waveform under test which may be a real time signal is supplied via lead 711 to the inverting input of the comparator-integrator loop 712 including a latching comparator 713. The output of the latching comparator is connected through a resistor 714 to a node 715. Node 715 is connected to the inverting input of the operational amplifier 716 whose output is taken from the operational amplifier output node 717. An integrating capacitor 718 is connected between the input node 715 and the integrator output node 717 to form an integrator 728. The signal from the output node 717 is connected back via lead 719 to node 720 and from node 720 via feedback lead 724 to the non-inverting reference input of the latching comparator 713.

The input signal on lead 711 is also supplied to a trigger or phase locked loop circuit as conventionally known for locking onto the signal at some pre-selected point or reference. The trigger or phase locked loop circuit of block 725 supplies an output to a programmed delay or phase shifter 726 which also includes means for generating the comparator strobe signals which are supplied via lead 727 to the latch enable input of the latching comparator 713 for sampling purposes. Once the comparator-integrator feedback loop has caused the equilibrium state to be reached and the final value to appear at node 717, the computer controller 723 will have the analog-to-digital converter 722 convert the analog final value into its digital equivalent and supply the digital equivalent to the computer controller 723 for storage and possible future processing and analysis. Many variations of this system are possible and would be obvious to those of ordinary skill in the art given the teaching of applicants' present systems.

Figure 21:
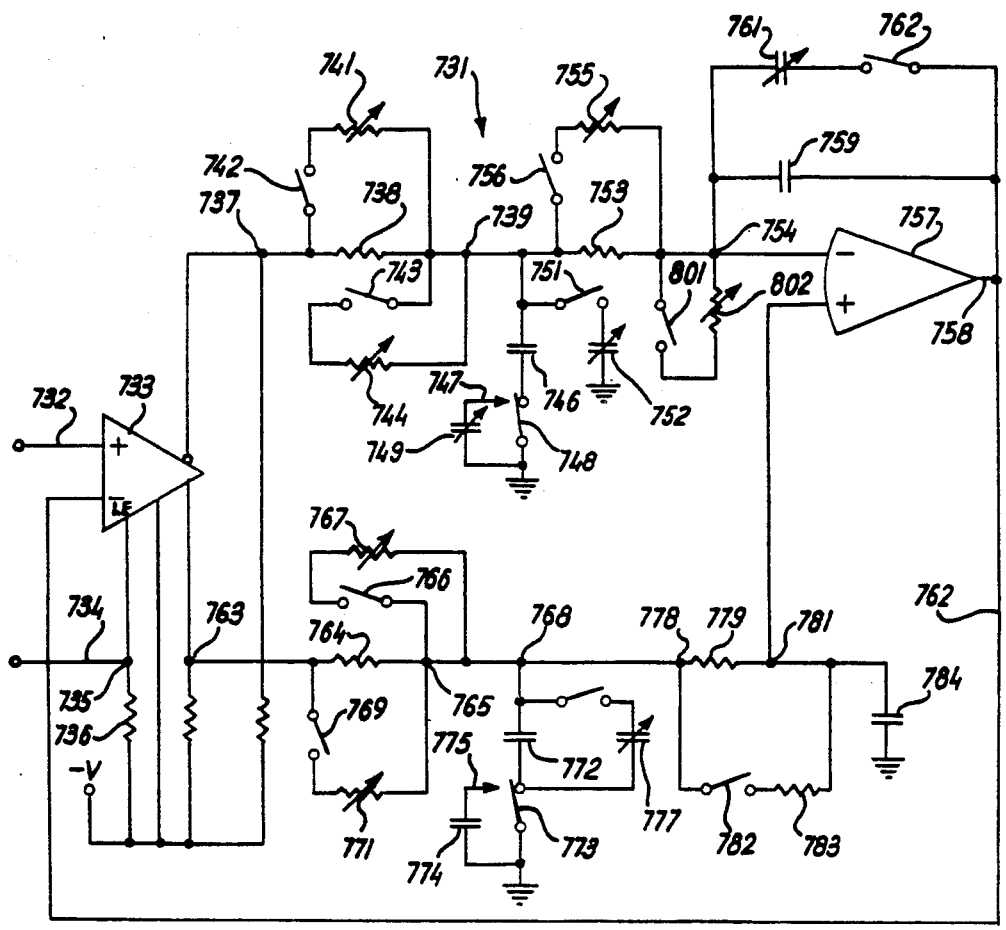
FIG. 21 is a schematic diagram of an improved comparator-integrator loop usable in the present system

The circuit of FIG. 21 which illustrates a modified comparator-integrator loop 731 will now be described. The signal input is supplied via lead 732 to the non-inverting input of a latching comparator 733. The latch enable input of the latching comparator 733 receives comparator strobe signals from the strobe input node 735 via lead 734. Node 735 is also connected to a negative source of potential through a resistor 736.

The inverting output of the latching comparator 733 is supplied direclty to the output node 737. Node 737 is connected through resistor 738 to node 739. Node 737 is also connected through the series combination of a normally-open switch 742 and a variable resistor 741 to node 739 so that the variable resistor 741 is normally not in the circuit but when the switch 742 is closed, the resistor 741 is placed in parallel with resistor 738 for changing the time constants of the circuit and the like. Node 739 is also connected to one terminal of a variable resistor 744 whose opposite terminal is connected to a normally-opened switch 743 which has the opposite terminal connected back to node 739 so that as long as the switch 743 is opened, variable resistor 744 is out of the circuit but when switch 743 is closed, the variable resistor 744 is placed in series with resistor 738 for again changing the time constants of the circuit and the like.

Node 739 is further connected through a capacitor 746 and a normally-closed switch 748 to ground. A second capacitor 749 has one plate connected to ground and the opposite plate connected to a normally-opened switch contact 747 such that as long as the switch 748 remains closed, capacitor 749 is out of the circuit but when the switch 748 is opened to close on contact 747, the variable capacitor 749 is placed in series with the capacitor 746. Yet further, node 739 is connected through a normally-opened switch 851 and a variable capacitor 752 to ground so that when the switch 751 is closed, capacitor 752 is placed in parallel with capacitor 746. Node 739 is yet further connected through a resistor 753 to an input node 754 at the inverting input of an operational amplifier 757. The node 739 is further connected through a normally-opened switch 756 and a variable resistor 755 to node 754 so that when the switch 756 is closed, variable resistor 755 is placed in parallel with resistor 753. Node 754 may be connected back upon itself through the combination of a normally-opened switch 801 and a variable resistor 902 so that when the switch 801 is closed, the variable resistor 801 is placed in series with the resistor 753.

The output of the operational amplifier 747 is taken from the operational amplifier output node 758. An integrating capacitor 750 is operatively connected between the input node 754 and the output node 758 for forming an integrator as known in the art. Node 759 is also connected to a normally-opened switch 762 and a variable capacitor 761 back to the input node 754 so that as long as the switch is opened, capacitor 761 remains out of the circuit but when the switch 762 closes, the capacitor 761 is placed in parallel with the integrating capacitor 759 for selectively altering the slope of the integrater.

The non-inverting output of the latching comparator 733 is connected directly to an output node 763. Node 763 is connected through resistor 764 to a node 765. Node 763 is also connected through a normally-opened switch 760 and the variable resistor 771 to the node 765 so that when the switch 769 is closed, the variable resistor 771 is placed in parallel with resistor 764. Further, the node 765 is connected through a normally-opened switch 766 and a variable resistor 767 back upon node 768 so that when the switch 766 is closed, variable resistor 767 is placed in series with resistor 764. The node 768 is also connected through a capacitor 722 and a normally-closed switch 773 to ground. A capacitor 774 has one plate connected to ground and its opposite plate connected to a normally-open switching contact 775 so that when the normally-closed switch 773 remains closed, only the capacitor 772 is connected between node 768 and ground, but when the switch 773 opens on contact 775, the capacitor 774 is placed in series with capacitor 772 for varying the value thereof.

Node 768 is also connected through a normally-opened switch 776 and a variable capacitor 777 to the input of the normally-closed switch 773, so that when the switch 774 is closed, variable capacitor 777 is placed in parallel with capacitor 772 between node 768 and ground. Node 778 is also connected through a resistor 779 to node 781 and node 781 is connected directly to the non-inverting node of the operational amplifier 757. Node 778 is also connected through a normally-opened switch 782 and the variable resistor 783 to node 781, so that when the switch 782 is closed, variable resistor 783 is placed in parallel with resistor 779. Node 781 is also connected to ground through a capacitor 784. The circuit of FIG. 21 is simply meant to illustrate the various ways for selectively modifying the time constants in the circuit and particularly in the T-filter networks which serve to round off the signal spikes and to set the current to the integrator so as to control the slope of the integrator. While not shown, similar if not substantially identical circuitry can be provided in the T-filter network of the feedback loop for varying the parameters to optimize preventing oscillations at the operational amplifier output when the sampling at the latching input would normally tend to produce them, for preventing ringing, and for rounding off signal spikes in the feedback path, which enables the system of the present invention to attain the previously unattainable. In actual practice, the switches would be implemented as FET, or the like.

Figure 22:
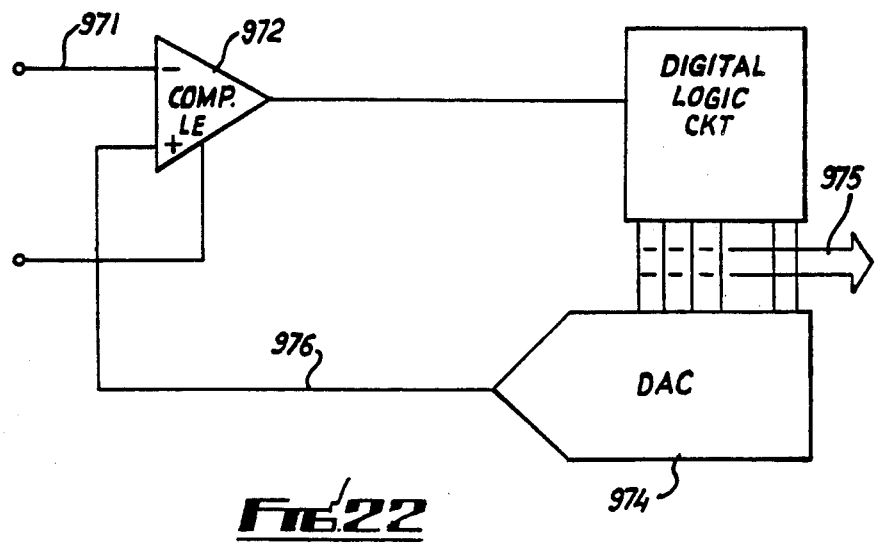
FIG. 22 is a block diagram of another embodiment of the comparator-integrator loop usable in the present system.

The comparator-integrator loop used in the present invention could also be implemented by replacing the integrator with a suitable logic network and a DAC to form an Analog-to-Digital conversion loop as shown in FIG. 22. The waveform to be tested is supplied via lead 961 to the signal input of a latching comparator 972 whose output is connected to a digital logic network 973 which could be computer controlled, hard-wired or the like. The logic network 973 has its outputs coupled to the inputs of a DAC 974 and an output lead or parallel port 975 supplies the final digital valve produced directly to a digital computer or the like for storage, display, processing and waveform analysis. The DAC output on lead 976 is coupled to the reference input of comparator 972 and strobe pulses are supplied to the latch enable input on lead 977.

The digital logic 974 searches for a DAC 074 valve which just causes the comparator 972 to switch. This is essentially an A/D converter with a latching comparator and the logic network 973 zeros in on an equilibrium condition, the final value can be supplied via output 975 for further processing. The system could also use a "successive approximation" approach utilizing the digital logic and DAC loop.

The basic concept of the sampling waveform digitizer can be implemented in a variety of ways, depending upon the desired application. For engineering design and development work, the system can be configured as a digital sampling oscilloscope as shown generally in FIG. 20. This would combine direct viewing of the signal with digital waveform storage for software analysis. The comparator-integrator sampling circuit would probably be located at the probe tip rather than inside the oscilloscope, thus avoiding the problem of accurately driving a terminated cable. For probing custom-built test extras, the sampling circuit need not even be attached to the probe. It is inexpensive enough to be incorporated at one or more test poimts in the layout of the fixture itself to minimize probe lead lengths and grounding problems.

In the production environment, it may be advantageous to incorporate the digitizer of the present invention into a test head which connects to existing automatic test equipment. The time base (programmable delay function) and sampling circuit could reside in the test head itself and some degree of local computer intelligence might also be useful to avoid overloading the central system processor with the details of running the test.

Further improvements in bandwidth and resolution will probabaly depend almost entirely on the design of faster and more accurate latching comparators, barring the development of even more precise ways to sample high speed signals. One of the limitations of any production test is the requirement that the DUT must be easily inserted and removed from the tester. Any kind of socket tends to be detrimental to the performance of high speed devices which are designed to work best when soldered onto a circuit board with a good ground plane.

With this detailed description of the specific apparatus and method used to illustrate the preferred embodiment of the present invention and the operation thereof, as well as various alternate embodiments of the present invention, it will be obvious to those skilled in the art that various modifications can be made in the design and implementation of the present inventive concept without departing from the spirit and scope of the present invention, which is limited only by the appended claims.

We claim:
1. A comparator-integrator loop comprising:
   a latching comparator with a signal input adapted for connection to the output of a device under test;
   an operational amplifier with its output coupled to a reference input of said comparator;
   an integrating capacitor that couples said amplifier output to the inverting input of said amplifier, whereby said amplifier and capacitor form an integrator;

filter means disposed between an output of said comparator to the inverting input of said amplifier for rounding off signal spikes;

means for clocking a latch enable input of said comparator until the output of said amplifier is in an equilibrium state; and means for establishing a current that flows into the input of said integrator.

2. The comparator-integrator loop of claim 1 wherein said latching comparator includes an analog input stage and an output stage with the latching function occurring in the analog input stage which has a relatively moderate gain and a relatively high bandwidth for substantially eliminating propagation delays and bandwidth limitations in the high gain output stage so as to introduce substantially no error into the accuracy of the measurement, said latch enable input including means for implementing rising-edge triggering of latching to substantially reduce aperture time and further improve the operation of the loop.

3. The comparator-integrator loop of claim 1 additionally comprising a hold-down resistor operatively coupled between the output of said latching comparator and a source of negative potential.

4. The comparator-integrator loop of claim 3 wherein said comparator output includes a first inverting output and a second non-inverting output, said filter means having a first section disposed between the inverting output of said latching comparator and the inverting input of said operational amplifier integrator, and a second section disposed between the non-inverting output of said latching comparator and the non-inverting input of said operational amplifier integrator, said first and second sections being substantially identical.

5. The comparator-integrator loop of claim 4 wherein each section of said filter means includes an RC filter including means for selectively increasing and decreasing the values of a resistance and a capacitance of said RC filter.

6. The comparator-integrator loop of claim 1 wherein said filter means includes a first filter resistor having one terminal operatively coupled to said latching comparator output;

said means for esablishing including a second resistor in series with said first resistor and having one terminal operatively coupled to the opposite terminal of said first filter resistor and its opposite terminal operatively coupled to the inverting input of the operational amplifier integrator; and said filter means further including a filter capacitor operatively coupled between the junction of said first and second resistors and ground.

7. The comparator-integrator loop of claim 6 including a third resistor coupled between the output of said integrator and a reference input of said latching comparator.

8. The comparator-integrator loop of claim 7 wherein said filter means includes a fourth resistor having one terminal operatively coupled to the output of the operational amplifier integrator;

a fifth resistor operatively coupled between the other terminal of said fourth resistor and a reference input of said latching comparator for forming a feedback loop; and a capacitor operatively coupled between the junction of said fourth and fifth resistors and the ground.

9. The comparator-integrator loop of claim 6 wherein said feedback loop includes an operational amplifier voltage follower means having at least one input operatively coupled to the output of said operational amplifier for buffering the output of the operational amplifier integrator to prevent current spikes and the like;

voltage divider means for establishing a gain factor for the overall comparator-integrator loop; and means for further smoothing the feedback signal and improving the overall accuracy of the integration process of the present system.

* * * * *